(12) United States Patent
Sauk et al.

(10) Patent No.: US 6,744,267 B2
(45) Date of Patent: Jun. 1, 2004

(54) TEST SYSTEM AND METHODOLOGY

(75) Inventors: Frank M. Sauk, San Ramon, CA (US); Gary A. Wells, Fremont, CA (US); Thomas P. Ho, Los Altos, CA (US)

(73) Assignee: NPTest, LLC, San Jose, CA (US)

( * ) Notice: Subject to any disclaimer, the term of this patent is extended or adjusted under 35 U.S.C. 154(b) by 0 days.

(21) Appl. No.: 10/197,134

(22) Filed: Jul. 16, 2002

(65) Prior Publication Data

US 2004/0012400 A1 Jan. 22, 2004

(51) Int. Cl.⁷ .............................................. G01R 31/02
(52) U.S. Cl. .................... 324/754; 324/755; 324/758
(58) Field of Search ............................... 324/754–758, 324/765, 158.1; 439/482, 824

(56) References Cited

U.S. PATENT DOCUMENTS

| | | | | |
|---|---|---|---|---|
| 5,422,574 A | * | 6/1995 | Kister .......................... | 324/754 |
| 6,104,202 A | * | 8/2000 | Slocum et al. ............... | 324/758 |
| 6,420,888 B1 | * | 7/2002 | Griffin et al. ................ | 324/754 |

OTHER PUBLICATIONS

Rincon, Reynaldo and West, John F., "A Custom Direct Dock High Speed Load Module and Lid for IDS Diagnostic Systems", Texas Instruments, Inc., IDS Users Conference Advanced Training, Aug. 14, 1997.

* cited by examiner

Primary Examiner—David A. Zameke
Assistant Examiner—Minh N. Tang
(74) Attorney, Agent, or Firm—Dorsey & Whitney LLP

(57) ABSTRACT

A test system for testing an electronic device is deployable in two basic configurations. In one of the configurations, a load board (62) that receives a unit (60) of the device is directly attached to a test head (16). In the other configuration, the same load board or one having largely the same pattern of test-head signal transmission positions is coupled through an interface apparatus (66) to a test head. A probe system (64) contacts that load board or/and the interface apparatus. The interface apparatus is normally configured to largely prevent test-head vibrations from being transferred to the probe system. Additionally or alternatively, the load board is vacuum attached to the interface apparatus.

48 Claims, 11 Drawing Sheets

TEST SYSTEM AND METHODOLOGY

FIELD OF USE

This invention relates to test equipment and test techniques, especially equipment and techniques for testing electronic devices such as integrated circuits.

BACKGROUND ART

Integrated circuits ("ICs") can be tested in various ways. One test technique is to electrically stimulate an IC and then monitor its electrical response, typically by comparing the actual response to a reference response. The stimulation/response-monitoring technique is commonly performed with automated test equipment connected to the external electrical leads, commonly referred to as pins, by which the IC interacts with the outside world. The test equipment stimulates the IC by providing electrical signals to the IC's pins and then monitoring the resultant electrical signals provided from the IC on its pins.

Another test technique involves probing an IC, especially when the IC has failed and it is desirable to determine the reason(s) for failure. The probing technique can be done by directing radiation, such as light or electrons, toward parts of the IC.

FIG. 1 illustrates a conventional test system that combines a stimulation/response-monitoring technique with an electron-beam probing capability for testing an integrated circuit 10 referred to generally as a device under test ("DUT"). The test system in FIG. 1 consists of core automated test equipment 12, manipulator 14, test head 16, tester load board 18, interface module 20, device-side load board (or card) 22, and electron-beam probe system 24 which contains an electron-beam probe (not separately shown). DUT 10 is situated in probe system 24 and attached to device-side board 22 also situated in probe system 24.

Interface module 20 interfaces between probe system 24 and test head 16. Module 20 consists of tester-side body 26, device-side body 28, and flexible electrical cables 30 which pass through openings in bodies 26 and 28 to connect tester board 18 to device-side board 22. Tester board 18, which electrically connects head 16 to electrical cables 30 along tester-side body 26, is customized to match head 16. Different implementations of board 18 permit interface module 20 to be utilized with different versions of head 16. Device-side board 22, which connects cables 30 to the pins of DUT 10, is similarly customized for testing DUT 10. Different versions of board 22 enable module 20 to be employed with different types of DUT 10.

During test operation, test equipment 12 generates electrical signals which are supplied through components 14, 16, 18, 20, and 22 to stimulate DUT 10. The resulting electrical response from DUT 10 is then furnished in the other direction through components 22, 20, 18, 16, and 14 to test equipment 12 for evaluation. The electron-beam probe in probe system 24 probes DUT 10 to form an image of a portion of DUT 10. The probing may be done as test signals generated by equipment 12 are used to stimulate DUT 10. The flexible nature of cables 30 in interface module 20 substantially prevents vibrations in test head 16 from being transmitted through module 20 to probe system 24.

Production units of an IC are commonly tested with automated test equipment in which a unit of the IC is attached to a production load board mounted directly on the test head of the automated test equipment. When the IC is also to undergo composite electrical testing/electron-beam probing using the test system of FIG. 1, device-side load board 22 is an additional load board that must be provided. That is, testing the IC entails designing two different types of custom load boards, device-side board 22 and the production load board mounted directly on the test head.

Rincon et al ("Rincon"), "A Custom Direct Dock High Speed Load Module and Lid for IDS Diagnostic Systems", IDS User Conf. Advanced Training, Aug. 14, 1997, pages 1–5, describes how production testing of an IC and composite electrical testing/electron-beam probing of the IC can be done with only one custom load board. FIG. 2 illustrates a somewhat simplified version of part of the test system employed by Rincon for performing composite electrical testing/electron-beam probing. Heat-exchange equipment, alignment features, and attachment hardware (bolts and screws) are not shown in FIG. 2 to avoid illustration complexity.

For composite electrical testing/electron-beam probing, Rincon employs interface apparatus 32 for connecting electron-beam probe system 24, a lid-modified variation of the Schlumberger IDS 10000® electron-beam probe system, to test head 16 of a Texas Instruments V-Series tester. The components of interface apparatus 32 include (a) main body 34, (b) spring-loaded probes 36 that extend through openings in main body 34, (c) vacuum seal board 38 that contacts test head 16, and (d) vacuum seal ring 40 for hermetically sealing main body 34 to seal board 38 so as to maintain DUT 10 in a high vacuum provided by probe system 24. Main body 34 is formed with three plates (not separately shown) bolted to each other. Spring-loaded probes 36 electrically connect seal board 38 to customized production load board 42 that receives DUT 10 along an opening in board 42.

Lock ring 44 locks main body 34 of interface apparatus 32 to test head 16. Another lock ring (not shown) locks load board 42 to main body 34 situated on lid 46 of probe system 24. Item 48 in FIG. 2 is a vacuum seal ring for hermetically sealing main body 34 to lid 46. Item 50 is a column of the electron-beam probe. Opposite to what is illustrated in FIG. 2, DUT 10 can be mounted on the bottom side of load board 42. In that case, spacers are placed between lid 46 and main body 34 to adjust the position of DUT 10 above probe column 50.

By utilizing production load board 42 in the test system of FIG. 2, Rincon provides an economic advantage because only one type of custom load board needs to be designed to perform both production testing and composite electrical testing/electron-beam probing. However, vibrations can occur in test head 16. These vibrations can be readily transmitted through lock ring 44 and main body 34 to probe system 24. While the vibrations may not seriously impair the performance of the electron-beam probe, such vibrations can significantly impair the performance of certain other types of probes such as optical probes.

It is desirable to have a capability for performing electrical testing/probing with a composite test system in which the transmission of test-head vibrations to the probe is substantially avoided and in which units of the device under test are mounted on a load board that can be directly attached to the test head for additional, typically production, testing.

GENERAL DISCLOSURE OF THE INVENTION

The present invention provides such a test capability. In accordance with the invention, a system for testing an electronic device contains one or more test heads, one or more load boards for receiving units of the electronic device, a probe system having a probe, and an interface apparatus. When there are two or more load boards, the load boards have largely identical patterns of test-head signal transmission positions.

The test system is deployable in a direct configuration and in an interface configuration. In the direct configuration, one such load board is attached directly to one such test head for transmitting test signals through that board's signal transmission positions. One or more test operations are performed according to the invention as the load board receives a unit of the electronic device.

In the interface configuration, one such load board is coupled through the interface apparatus to one such test head for transmitting test signals through that board's signal transmission positions. The probe system contacts the interface apparatus or/and the load board. One or more test operations are performed according to the invention as the load board receives a unit of the electronic device. Importantly, the interface apparatus is configured to largely prevent vibrations in the test head from being transferred through the interface apparatus to the probe system. As a result, the probe can be an optical or other probe highly sensitive to vibrations of the type that occur in the test head. The probe can, of course, also be an electron-beam or other probe of lesser sensitivity to such vibrations.

The isolation of the probe system from vibrations that occur in the test head is preferably achieved by configuring the interface apparatus to include a tester-side structure, a device-side body, and a vibration isolation system. The tester-side structure is attached to the test head. The device-side body is attached to the load board. The vibration isolation system, typically implemented with electrical cables, flexibly connects the tester-side structure to the device-side body while largely preventing vibrations in the tester-side structure from being transferred through the isolation system to the device-side body. Vibrations transferred from the test head to the tester-side structure are largely prevented from reaching the device-side body and thus are largely prevented from being transferred to the probe system.

In addition to, or as an alternative to, isolating the probe system from vibrations that occur in the test head, a substantial vacuum typically provided through the test head is employed to attach the load board to the interface apparatus and typically also to attach the interface apparatus to the test head. As used here, vacuum attachment of two bodies situated in an environment at some pressure external to the bodies means that the two bodies are attached to each other along a region at a pressure below the external pressure, typically 1 atmosphere, such that the external pressure exerted elsewhere on the bodies holds them in largely a fixed positional relationship to each other. The pressure in the vacuum-attachment region can be a substantial fraction of the external pressure and thus need not be at a high vacuum level such as that in free space.

In contrast to the electrical testing/electron-beam probing configuration of Rincon in which the interface apparatus and production load board are mechanically attached to the test head, the present vacuum attachment capability avoids the use of mechanical attachment equipment and thus is relatively simple. Also, vacuum attaching the load board and interface apparatus to the test head in the present invention takes advantage of the vacuum capability provided in certain test heads for vacuum attaching load boards directly to the test heads.

Regardless of whether one, or more than one, load board is employed in testing an electronic device according to both configurations of the present test system, the present invention only requires that one type of load board be designed because, in the case where two or more load boards are employed, the load boards have substantially the same pattern of test-head signal transmission positions. The invention thereby achieves the load-board economic advantage of Rincon's test system while simultaneously going beyond Rincon by allowing a vibration-sensitive probe, such as an optical probe, to be employed in the interface configuration of the present test system. Accordingly, the invention provides a significant advance over the prior art.

BRIEF DESCRIPTION OF THE DRAWINGS

Like reference symbols are employed in the drawings and in the description of the preferred embodiments to represent the same, or very similar, item or items.

DESCRIPTION OF THE PREFERRED EMBODIMENTS

Figure 3A:
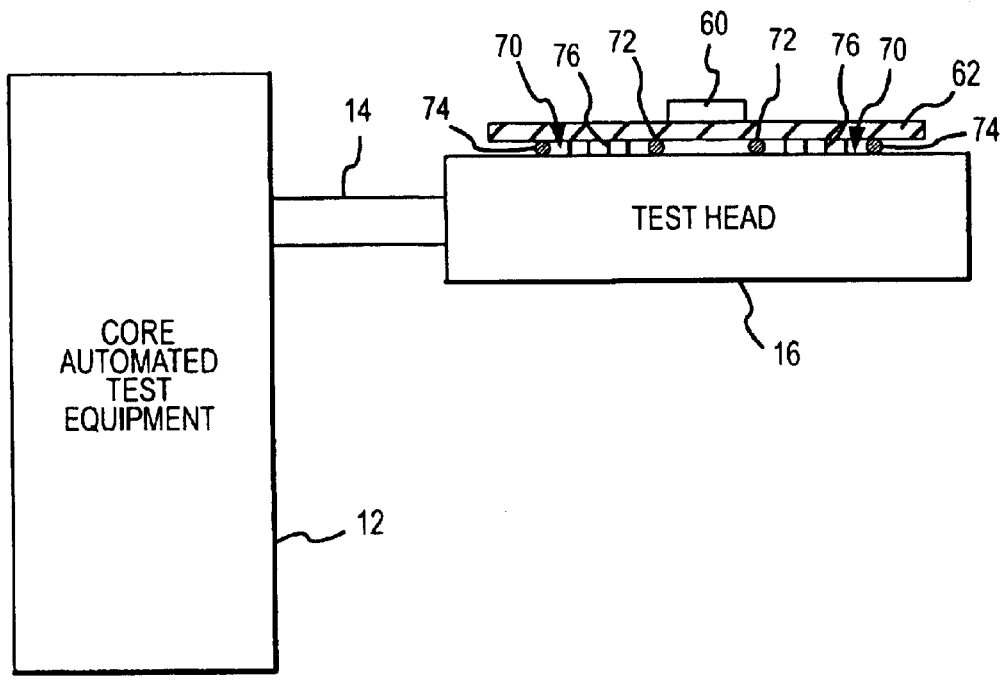
FIGS. 3a and 3b are composite block diagrams/side cross-sectional views of two configurations of a test system arranged according to the invention.
Figure 3B:
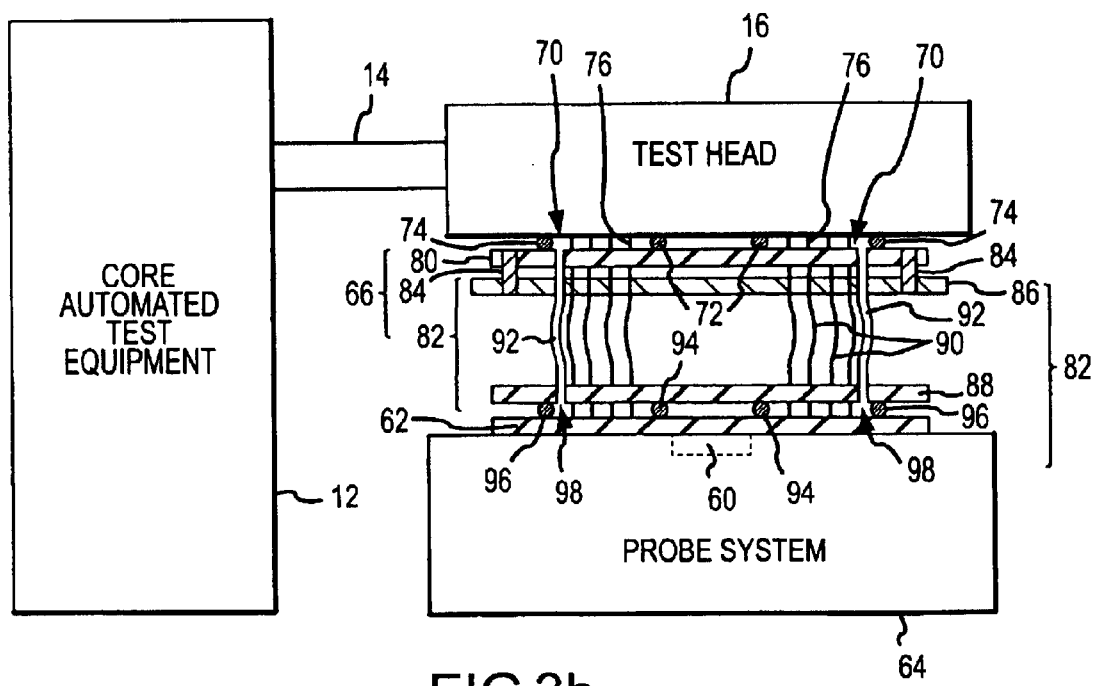

FIGS. 3a and 3b illustrate two configurations of a test system arranged in accordance with the invention for testing or/and examining units 60 of an electronic device, typically an IC. The test system of FIGS. 3a and 3b furnishes a digital test capability or/and an analog test capability. Hence, the device under test (again, "DUT") can be a digital device, an analog device or a device having both digital and analog (mixed-signal) circuitry.

Figure 1:
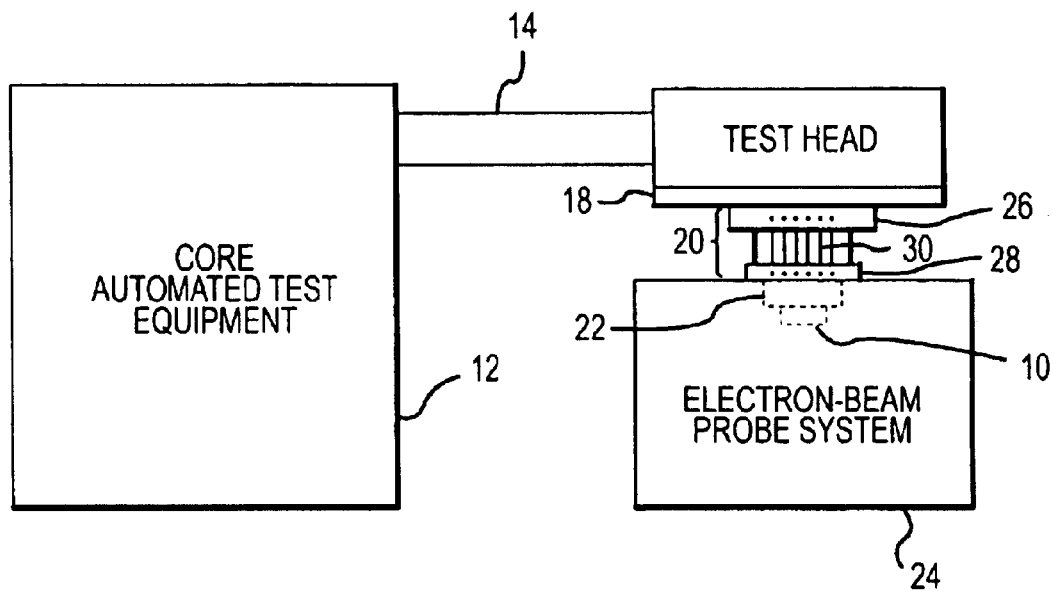
FIG. 1 is a block diagram of a conventional test system for performing electrical testing and electron-beam probing.
Figure 2:
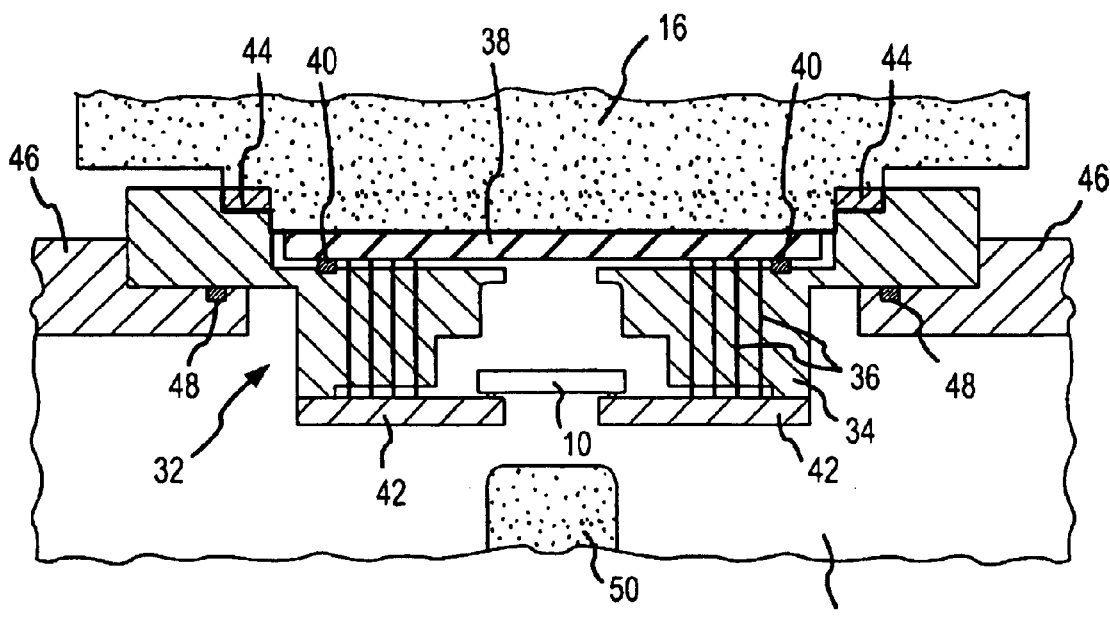
FIG. 2 is a simplified cross-sectional view of another conventional test system for performing electrical testing and electron-beam probing.

The test system of FIGS. 3a and 3b consists of core automated test equipment 12, manipulator 14, one or more test heads 16, one or more load boards 62, a probe system 64, and an interface apparatus 66. Each configuration of the present test system includes automated test equipment 12, manipulator 14, and one test head 16. Test equipment 12, manipulator 14, and head 16 in each test configuration are arranged and operable the same as described above in connection with the test system of FIG. 1. Head 16 in the configuration of FIG. 3b may be the same as, or different from, head 16 in the configuration of FIG. 3a. Components 12, 14, and 16 in each configuration of the test system of the invention can, for example, be implemented with the Schlumberger ITS 9000® automated test system.

Each configuration of the present test system includes one load board 62 that receives a unit 60 of the DUT. Each load board 62 is typically a production load board designed and fabricated for testing device units 60 during production manufacture. Board 62 in the configuration of FIG. 3b may be the same as, or different from, board 62 in the configuration of FIG. 3a. When there are multiple boards 62, each board 62 has a pattern of test-head signal transmission positions largely identical to the pattern of test-head signal transmission positions of each other board 62. While boards 62 may differ in characteristics, such as certain physical dimensions, not pertinent to their patterns of signal transmission positions, each board 62 typically is physically largely identical to each other board 62.

Automated test equipment 12, manipulator 14, one test head 16, and one load board 62 form the test system of FIG. 3a. The test system of FIG. 3b also contains probe system 64 and interface apparatus 66. The probe in probe system 64 is typically formed by directing a focused beam of radiation toward a device unit 60. The radiation is, as indicated below, typically electrons or light so that the probe is a substantially non-intrusive probe. The radiation can also be ions. Alternatively, the probe can be an intrusive probe such as a mechanical probe.

The configuration of FIG. 3a is referred to here as the direct configuration because, as indicated in FIG. 3a, load board 62 is directly attached to test head 16. The attachment of board 62 to head 16 in the direct configuration is performed along an annular region 70 by a substantial vacuum provided through head 16. The inner periphery of evacuable region 70 is established by an inner vacuum seal 72 situated between head 16 and board 62. The outer periphery of region 70 is similarly established by an outer vacuum seal 74 situated between head 16 and board 62. Board 62 is airtight along region 70.

The vacuum provided through test-head 16 to evacuable region 70 for attaching load board 62 to head 16 is typically a relatively low vacuum at a below-external pressure of 200–300 torr. With head 16 and board 62 situated in an external environment at atmospheric pressure, typically 1 atmosphere or 760 torr, this corresponds to providing 460 torr (18 in. Hg) to 560 torr (22 in. Hg) of vacuum in region 70.

Inner vacuum seal 72 can sometimes be deleted in the direct configuration of the present test system depending on the physical configuration of load board 62. When an opening extends through board 62 at a location laterally inside outer vacuum seal 74, as occurs, for example, in the test system implementation of FIGS. 4a and 4b, inner seal 72 is positioned laterally fully outside (beyond) this opening so as to prevent air from passing through the opening and into region 70. In such a case, inner seal 72 is a necessary element for enabling a substantial vacuum to be provided in region 70 by way of test head 16. Conversely, seal 72 can be deleted if no such opening extends through board 62 and it is airtight along the surface portion that would otherwise be laterally enclosed by seal 72. Region 70 then changes from an annular shape to a generally cylindrical shape. Board 62 can also be mechanically attached to head 16.

Probes 76 contact electrically conductive traces (not separately shown here) along one side of load board 62. In the direct configuration, the test surface of head 16 normally points upward with board 62 situated above head 16.

Electrical test signals pass through spring-loaded probes 76. More particularly, testing a device unit 60 in the direct configuration involves providing test signals from test head 16 through probes 76 to the test-head signal transmission positions of load board 62. Board 62 processes the test signals received from head 16 and converts them into input test signals furnished to unit 60. This causes unit 60 to furnish output test signals to board 62. Board 62 processes the test signals received from unit 60 and converts them into further test signals provided from the board's test-head signal transmission positions through probes 76 to head 16.

The configuration of FIG. 3b is referred to here as the interface configuration because, as shown in FIG. 3b, load board 62 is coupled through interface apparatus 66 to test head 16 with probe system 64 contacting board 62 and/or apparatus 66. FIG. 3b illustrates an embodiment in which system 64 contacts board 62 but not apparatus 66. In other embodiments, system 64 can contact board 62 and apparatus 66, or apparatus 66 but not board 62. In any event, apparatus 66 acts as an interface between head 16 and system 64 for testing a unit 60 of the DUT.

Interface apparatus 66 consists of an adapter board 80, an interface module 82, and a mechanism 84 that mechanically connects interface module 82 to adapter board 80. Connection mechanism 84 is typically bolts or/and screws. Adapter board 80 is situated largely between test head 16 and interface module 82. In the interface configuration with the test surface of head 16 pointing downward, module 82 is situated largely below board 80 which, in turn, is situated largely below head 16.

Similar to how load board 62 is vacuum attached to test head 16 in the direct configuration, adapter board 80 is attached to head 16 in the interface configuration along annular region 70 by a substantial vacuum provided through test head 16. The inner and outer peripheries of evacuable region 70 are again respectively defined by vacuum seals 72 and 74. Board 80 is airtight along region 70. Since interface module 82 is mechanically attached to board 80, interface apparatus 66 is thus vacuum attached to test head 16 along region 70 in the interface configuration. Additionally or alternatively, apparatus 66 can be mechanically attached to head 16.

Inner vacuum seal 72 can sometimes be deleted in the interface configuration depending on the physical characteristics of adapter board 80. The comments made above about sometimes deleting vacuum seal 72 in the direct configuration depending on the physical characteristics of load board 62 apply identically to potentially deleting seal 72 in the interface configuration.

Module 82 of interface apparatus 66 is situated between adapter board 80 and load board 62 that receives a unit 60 of the DUT. In the interface configuration with the test surface of test head 16 pointing downward, interface module 82 is situated above load board 62. Module 82 consists of a tester-side body 86, a device-side body 88, a group of primary flexible electrical interface cables 90, a vacuum hose system 92, an inner vacuum seal 94, and an outer vacuum seal 96.

Tester-side body 86 is specifically connected to adapter board 80 by way of connection mechanism 84. Adapter board 80, connection mechanism 84, and tester-side body 86 thereby form a tester-side structure 80/84/86 vacuum attached to test head 16. Tester-side body 86 at the bottom of tester-side structure 80/84/86 is positioned opposite, and spaced apart from, device-side body 88. In the interface configuration with the test surface of head 16 pointing downward, device-side body 88 is situated below tester-side body 86.

Electrical cables 90 and vacuum hose system 92 are the principal components of a vibration isolation system 90/92 that flexibly connects tester-side structure 80/84/86 to device-side body 88 while largely preventing vibrations in test head 16 from being transferred through isolation system 90/92 to body 88. Each electrical cable 90 passes, near one end, tightly through an opening in tester-side body 86 and is terminated at that end with a spring-loaded probe (not separately shown here) which contacts an electrically conductive trace (not separately shown here) along the lower side of adapter board 80. Each cable 90 similarly passes, near its other end, tightly through an opening in device-side body 88 and is terminated at that other end with another spring-loaded probe (not separately shown here) which contacts an electrically conductive trace (not separately shown here) along the upper side of load board 62. As a result of passing through openings in bodies 86 and 88, each cable 90 connects device-side body 88 to tester-side body 86 and thus to tester-side structure 80/84/86. The number of cables 90 is usually in excess of 500 and often in excess of 1,000.

Vacuum hose system 92 consists of one or more, typically four, vacuum hoses and associated fittings (not separately shown here) that provide one or more airtight paths through interface apparatus 66. Each combination of a vacuum hose and the associated fittings passes tightly through an opening in adapter board 80, through an opening in tester-side body 86, and through an opening in device-side body 88. As a result of passing tightly through the openings in bodies 86 and 88, each combination of a vacuum hose and the associated fittings connects device-side body 88 to tester-side body 86 and thus to tester-side structure 80/84/86. The openings provided in board 80 for vacuum hose system 92 occur along region 70 where board 80 is vacuum attached to test head 16.

Vibrations that occur in test head 16 are transmitted in various ways, e.g., through test-head probes 76 and vacuum seals 72 and 74, to tester-side structure 80/84/86. The sections of electrical cables 90 situated between bodies 86 and 88 include portions sufficiently flexible to substantially prevent vibrations in tester-side structure 80/84/86 from being transferred through those sections of cables 90 to device-side body 88. The sections of the vacuum hoses and associated fittings of vacuum hose system 92 situated between bodies 86 and 88 similarly include portions sufficiently flexible to substantially prevent vibrations in tester-side structure 80/84/86 from being transferred through those sections of the vacuum hoses and associated fittings to device-side body 88. Accordingly, vibration isolation system 90/92 substantially prevents test-head vibrations transmitted to tester-side structure 80/84/86 from being transmitted through system 90/92 to device-side body 88.

In the interface configuration, load board 62 is attached to interface apparatus 66, specifically device-side body 88, along an annular region 98 by a substantial vacuum provided through test head 16 and vacuum hose system 92. The openings provided in body 88 for vacuum hose system 92 occur along evacuable region 98. The inner periphery of region 98 is established by inner vacuum seal 94 situated between body 88 and load board 62. The outer periphery of region 98 is similarly established by outer vacuum seal 96 situated between body 88 and board 62. Body 88 and board 62 are both airtight along region 98.

Load board 62 is vacuum attached to interface apparatus 66 at the same time that apparatus 66 is vacuum attached to test head 16. This arises because the openings provided in adapter board 80 for vacuum hose system 92 occur along evacuable region 70 where board 80 is vacuum attached to test head 16. Similar to what occurs in the direct configuration, the vacuum provided through head 16 to regions 70 and 98 for attaching apparatus 66 to head 16 and for simultaneously attaching load board 62 to apparatus 66 is typically a relatively low vacuum at a below-external pressure of 200–300 torr. With head 16, apparatus 66, and board 62 situated in an external environment at atmospheric pressure, this corresponds to providing 460–560 torr of vacuum in regions 70 and 98.

Inner vacuum seal 94 can sometimes be deleted in the interface configuration of the present test system depending on the physical configuration of load board 62. When an opening extends through board 62 at a location laterally inside outer vacuum seal 96 as occurs (for example) in the test-system implementation of FIGS. 4a and 4b, inner seal 94 is positioned laterally fully outside this opening so as to prevent air from passing through the opening and into region 98. Inner seal 94 is then a necessary element for enabling a substantial vacuum to be provided in region 98 by way of test head 16 and interface apparatus 66. Conversely, seal 94 can be deleted if no such opening extends through board 62 and it is airtight along the surface portion that would otherwise be laterally enclosed by seal 94. In such a case, region 98 changes from an annular shape to a generally cylindrical shape.

Probe system 64 is contacted by load board 62 or/and device-side body 88 of interface apparatus 66. FIG. 3b illustrates an embodiment in which system 64 contacts board 62 but not body 88. In the interface configuration with the test surface of test head 16 pointing downward, board 62 is thus situated largely above system 64.

Unit 60 of the DUT is situated along load board 62. FIG. 3b depicts the cavity-up test mode in which unit 60 is attached to the bottom of board 62 and lies essentially inside probe system 64. By providing a suitable opening through board 62 along an area laterally bounded by inner vacuum seal 94, unit 60 can be attached to the top of board 62 in the cavity-down (or inverted-cavity) test mode.

Load board 62 is typical physically attached to probe system 64 to prevent relative movement between board 62 and system 64 from causing probe errors. For example, when the probe in system 64 is an electron-beam probe, board 62 is typically attached to system 64 by a high vacuum provided by system 64. Device unit 60 is exposed to this vacuum. In the electron-beam probe case, the vacuum employed for attaching board 62 to system 64 is normally $10^{-7}$–$10^{-5}$ torr, typically $10^{-6}$ torr, and is considerably stronger than the vacuum by which board 62 and interface apparatus 66 are attached to test head 16.

Any vibrations occurring in device-side body 88 could be transmitted to load board 62 by way of vacuum seals 94 and 96 and the spring-loaded probes at the lower ends of electrical cables 90. In the situation where board 62 contacts probe system 64, the vibrations in board 62 could then be transmitted from board 62 to system 64. When device-side body 88 contacts system 64, vibrations in body 88 could be directly transmitted to system 64.

Inasmuch as isolation system 90/92 substantially prevents test-head vibrations transmitted to tester-side structure 80/84/86 from being transmitted to device-side body 88, isolation system 90/92 substantially prevents vibrations in test head 16 from being transmitted through interface apparatus 66 directly to probe system 64 (if it contacts device-side body 88) or through load board 62 to probe system 64 (if it contacts load board 62). In other words, isolation system 90/92 isolates probe system 64 from vibrations in test head 16. Accordingly, the probe in system 64 can be implemented with a probe, such as an optical probe, highly sensitive to vibrations of the type typically occurring in head 16. A probe, such as electron-beam probe, less sensitive to test-head vibrations can also be employed in system 64. In that case, system 64 can be the Schlumberger IDS 10000 electron-beam probe system.

Electrical test signals pass through electrical cables 90 in testing a unit 60 of the DUT when the present test system is deployed in the interface configuration. In particular, test head 16 provides test signals through spring-loaded probes 76 to adapter board 80. Responsive to the test signals received from head 16, board 80 provides further test signals to cables 90. While board 80 can suitably process the test signals received from head 16, board 80 normally passes these test signals directly on to cables 90. Hence, board 80 normally functions as a pass-through board for signals received from head 16. Cables 90 provide the test signals received from adapter board 80 to the test-head signal transmission positions of load board 62. Consequently, interface apparatus 66 normally functions to pass the test signals received from head 16 directly through apparatus 16 to load board 62.

Load board 62 processes the test signals received from electrical cables 90 and converts them into input test signals furnished to device unit 60. Responsive to the input test signals, unit 60 furnishes output test signals to load board 62. Board 62 processes the test signals received from unit 60 and converts them into further test signals provided from the board's test-head signal transmission positions to cables 90. These further test signals pass through cables 90 and are provided to adapter board 80. Although board 80 can suitably process the further test signals received from cables 90, board 80 normally passes these test signals directly on to test head 16 by way of probes 76. Board 80 thus normally functions as a pass-through board for signals provided to head 16. Likewise, interface apparatus 66 normally functions to pass the further test signals received from load board 62 directly on to test head 16.

In short, the passage of test signals between test-head 16 and load board 62 is normally transparent to the presence of interface apparatus 66. This enables board 62 employed in the interface configuration to be the same as, or have largely the same test-head signal transmission positions as, board 62 used in the direct configuration.

The probe in probe system 64 probes unit 60 of the DUT, typically to produce an image or waveform of the probed portion of device unit 60. The probing may be done as test signals generated by automated test equipment 12 are provided through test head 16 and interface apparatus 66 to load board 62 for testing unit 60. Additionally, the probe may stimulate unit 60 and cause it to provide output test signals to board 62. Board 62 then suitably processes these output test signals and converts them into further test signals that are normally passed through apparatus 66 and supplied to head 16.

With the foregoing in mind, testing unit 60 of the DUT with the present test system deployed in the direct and interface configuration is performed generally in the following way. For the direct configuration, load board 62 is vacuum attached to test head 16 with its test surface normally pointing upward. A device unit 60 is subsequently mounted on board 62 but can be mounted on board 62 before vacuum attaching board 62 to head 16. Test operations are then performed on unit 60 by arranging for head 16 to supply and receive test signals in the manner described above for the direct configuration.

For the interface configuration, test head 16, interface apparatus 66, load board 62, and probe system 64 are brought together. This is normally done according to one of two basic interface-configuration assembly techniques. In one of these assembly techniques, board 62 is positioned appropriately on system 64 with unit 60 of the DUT attached to board 62. For cavity-up devices, unit 60 is attached to board 62 before it is placed on system 64. For cavity-down devices, unit 60 can be attached to board 62 before or after placing board 62 on system 64.

Next, interface apparatus 66 is appropriately placed on load board 62 so that device-side body 88 of apparatus 66 contacts board 62 and possibly probe system 64. Test head 16 is positioned above apparatus 66 and, with the test surface of head 16 pointing downward, is brought into contact with apparatus 66. The arrangement of the interface configuration is completed by vacuum attaching board 62 to apparatus 66 and simultaneously attaching apparatus 66 to head 16. This typically includes vacuum attaching board 62 to system 64.

In the other interface-configuration assembly technique, interface apparatus 66 is first placed on test head 16 with its test surface initially pointing upward. When the test equipment includes a capability for mechanically attaching apparatus 66 to head 16, apparatus 66 is mechanically attached to head 16. This ensures that apparatus 66 will not prematurely separate from head 16. Load board 62 is placed on apparatus 66 and vacuum attached to apparatus 66 at the same time that apparatus 66 is vacuum attached to head 16. For cavity-up devices, unit 60 of the DUT can be mounted on board 62 before or after apparatus 66 and board 62 are physically coupled to head 16. For cavity-down devices, unit 60 is mounted on board 62 prior to physically coupling apparatus 66 and board 62 to head 16.

Test head 16, interface apparatus 66, and load board 62 are turned upside down so that the test surface of head 16 points downward. Probe system 64 and head 16 are arranged so that system 64 is below board 62 after which system 64 is brought into contact with board 62 or/and device-side body 88 of apparatus 66. This contacting operation typically includes vacuum attaching system 64 to board 62 or/and body 88. Regardless of how the interface configuration is achieved, test operations are subsequently performed on unit 60 of the DUT by arranging for head 16 to supply and receive test signals in the manner described above for the interface configuration.

Figure 4A:
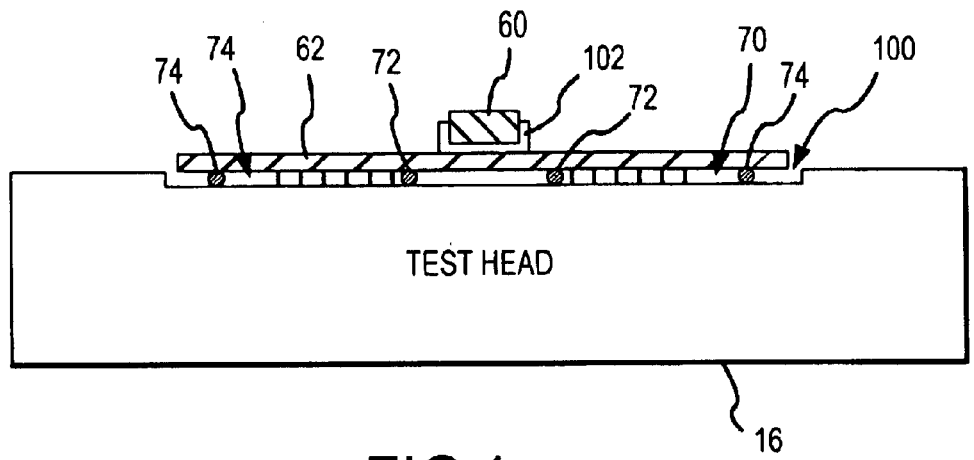
FIGS. 4a and 4b are composite block diagrams/side cross-sectional views of parts of two respective implementations of the two configurations of the test system of FIGS. 3a and 3b.

FIG. 4*a* illustrates part of an implementation of the test-system direct configuration of FIG. 3*a*. In the direct-configuration implementation of FIG. 4*a*, load board 62 may extend into a recess 100 in test head 16. Device unit 60 is placed in a socket 102 provided on load board 62.

Figure 4B:
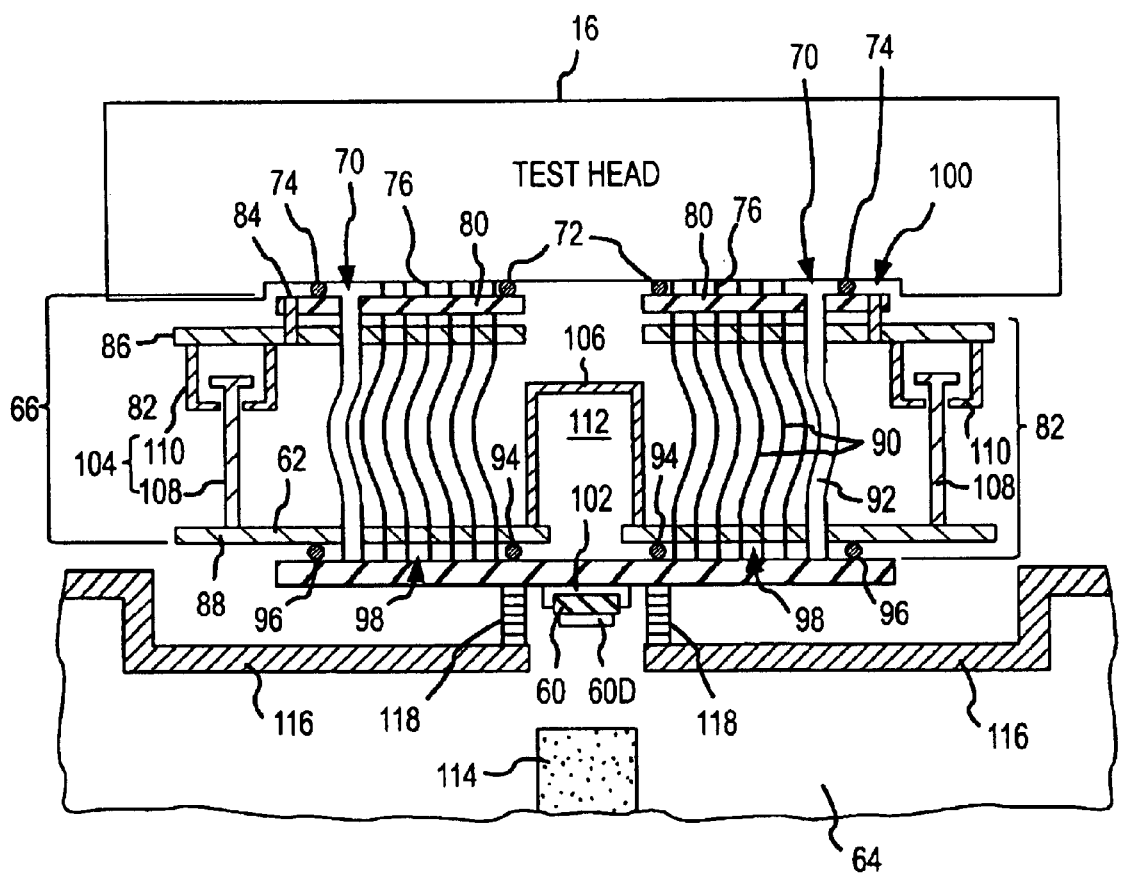

FIG. 4*b* illustrates part of an implementation of the test-system interface configuration of FIG. 3*b*. In the interface-configuration implementation of FIG. 4*b*, module 82 of interface apparatus 66 includes a movement-restricting mechanism 104 and a vacuum chamber 106 in addition to components 86, 88, 90, 92, 94, and 96.

Movement-restricting mechanism 104 protects interface module 82 by preventing its shape from being significantly distorted while module 82 is being handled. Mechanism 104 consists of a group, e.g., four, of combinations of a post 108 and a flange 110. Each post 108 is mounted on one of bodies 86 and 88. Corresponding flange 110 is mounted on the other of bodies 86 and 88. In the example of FIG. 4*b*, each post 108 is mounted on the upper (inside) surface of device-side body 88 while corresponding flange 110 is mounted on the lower (inside) surface of tester-side body 86 directly across from that post 108.

Each post 108 consists of a lower cylindrical section and an upper cylindrical section of considerably greater diameter than the lower cylindrical section. Each flange 110 has a cylindrical opening of greater diameter than the lower cylindrical section of associated post 108 but of lesser diameter then the upper cylindrical section of that post 108. The lower cylindrical section of each post 108 extends through the opening in associated flange 110. Because the upper cylindrical section of each post 108 is of greater diameter than the opening in associated flange, the relative movement of each flange 110 to corresponding post 108 is restricted (or constricted) both laterally and vertically. This restriction restricts the relative movement of tester-side body 86 to device-side body 88.

The dimensions of posts 108 and flanges 110 are chosen to be of such a nature that electrical cables 90 and system 92 are not extended beyond their normal full extensions. Consequently, movement-restricting mechanism 104 prevents cables 90 and system 92 from being separated from tester-side body 86 and device-side body 88. In other words, mechanism 104 prevents interface module 82 from being impaired during handling. During test operations, the relative position of body 88 to body 86 is normally adjusted so that cables 90 and system 92 are somewhat bent as generally indicated in FIG. 4*b*.

Also, the relative position of device-side body 88 to tester-side body 86 is normally adjusted so that each flange 110 is spaced apart from corresponding post 108. As a result, movement-restricting mechanism 104 avoids providing paths by which vibrations transmitted from test head 16 to tester-side structure 80/84/86 are further transmitted to device-side body 88 and then directly to probe system 64 (if it contacts device-side body 88) or through load board 62 to probe system 64 (if it contacts board 62). That is, mechanism 104 does not impair the vibration isolation otherwise furnished by vibration isolation system 90/92.

Vacuum chamber 106 is situated on device-side body 88 across from unit 60 of the DUT. Chamber 106 is also situated above an opening extending through device-side body 88 along the region enclosed by evacuable region 98. As a result, the combination of chamber 106, body 88, and inner vacuum seal 94 provides a sealed enclosure 112 along load board 62 directly opposite device unit 60. If inner seal 94 is insufficient to provide an airtight seal, a rubber O ring (not shown in FIG. 4*b*) is placed inside seal 94 to achieve an airtight seal for enclosure 112.

Consider the situation in which device unit 60 is to be subjected to a vacuum provided in probe system 64. Chamber 106 is furnished with a vacuum port (not separately shown here) that can provide a path to this vacuum. Sealed enclosure 112 can then be at largely the same vacuum to which unit 60 is subjected and which is employed to vacuum attach load board 62 to system 64. This enables the pressure along the top of board 62 in the region laterally enclosed by inner vacuum seal 94 to largely equal the pressure along the portion of board 62 situated opposite the region laterally enclosed by seal 94. Since the vacuum provided by system 64 is normally considerably higher than the vacuum provided by test head 16 in evacuable region 98 along board 62, the pressure equalization along the portion of board 62 extending along the region laterally enclosed by seal 94 helps prevent the higher vacuum provided by system 64 along the bottom of board 62 from overcoming the lower vacuum provided by head 16 in region 98 and causing board 62 to separate from interface apparatus 66. The pressure equalization also prevents board 62 from buckling.

Furthermore, when (a) unit 60 of the DUT needs to be in a high vacuum for probing with probe system 64 and (b) the interface configuration of the present test system is arranged in the cavity-down test mode with unit 60 situated on top of load board 62, unit 60 is situated in enclosure 112 of vacuum chamber 106. An opening, not shown in FIG. 4*b* but illustrated below in the embodiment of FIGS. 5–8, passes through load board 62 to enable the probe to reach unit 60. The high vacuum provided by system 64 along the bottom of board 62 then extends through this opening in board 62 to enable unit 60 to be in the requisite high vacuum.

An opening extends through each of adapter board 80 and tester-side body 86 above unit 60 of the DUT in the interface-configuration implementation of FIG. 4*b*. These two openings are used to facilitate assembly of interface apparatus 66 and permit apparatus modification. For instance, the two openings can be employed for removing vacuum chamber 106. The openings can then be utilized for installing a temperature bonnet (not shown) generally at the location previously occupied by chamber 106. The temperature bonnet is used to adjust the temperature of unit 60.

Device units 60 are, as mentioned above, typically units of an integrated circuit. For probing, part of the package of an IC is typically removed so as to expose the IC's die. Item 60D in FIG. 4*b* is the die of such a decapped unit 60.

Item 114 in FIG. 4*b* is a probe column, e.g., an electron-beam column, of probe system 64. Item 116 is the lid of system 64. Item 118 indicates a group of annular rings provided between lid 116 and load board 62. Rings 118 are utilized to adjust the spacing between probe column 114 and device unit 60 to achieve a desired operational spacing. Rings 118 include rubber O rings (not separately shown) for providing a high vacuum seal between board 62 and lid 116. Rings 118 and lid 116 can be provided as parts of interface apparatus 66.

FIGS. 5–8 present various views of an embodiment of interface module 82 for the test-system interface configuration of FIG. 4*b*. Module 82 in FIGS. 5–8 enables the DUT, again typically and IC, to have up to at least 1024 electrical leads for transmitting digital or/and analog signals.

Figure 5:
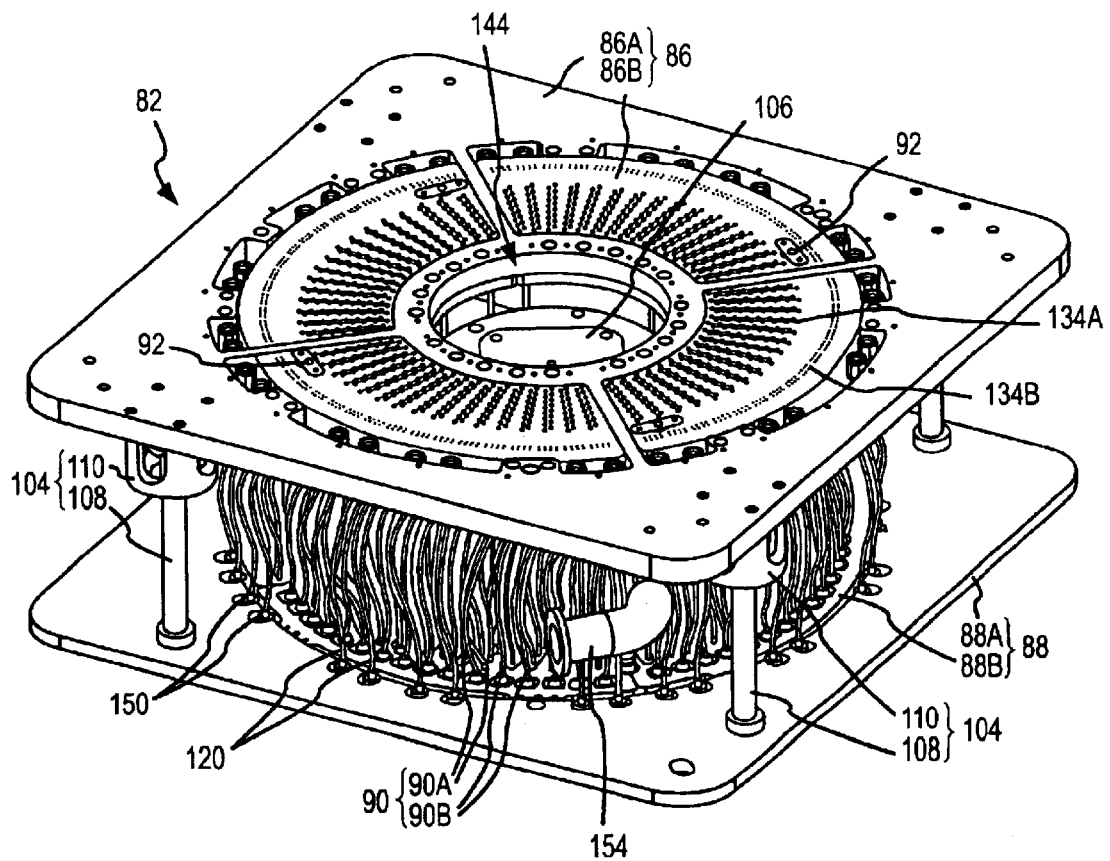
FIG. 5 is a perspective view of an interface module configured according to the invention for use in the test-system interface configuration of FIG. 4b.

FIG. 5 is a general perspective view of all of interface module 82 except that the portions of electrical cables 90 protruding upward out of openings in tester-side body 86 are, to avoid illustration complexity, not illustrated in the figure. Only a few of cables 90 actually appear in FIG. 5 because cables 90 are laterally surrounded by a group of additional flexible electrical interface cables 120.

Figure 6:
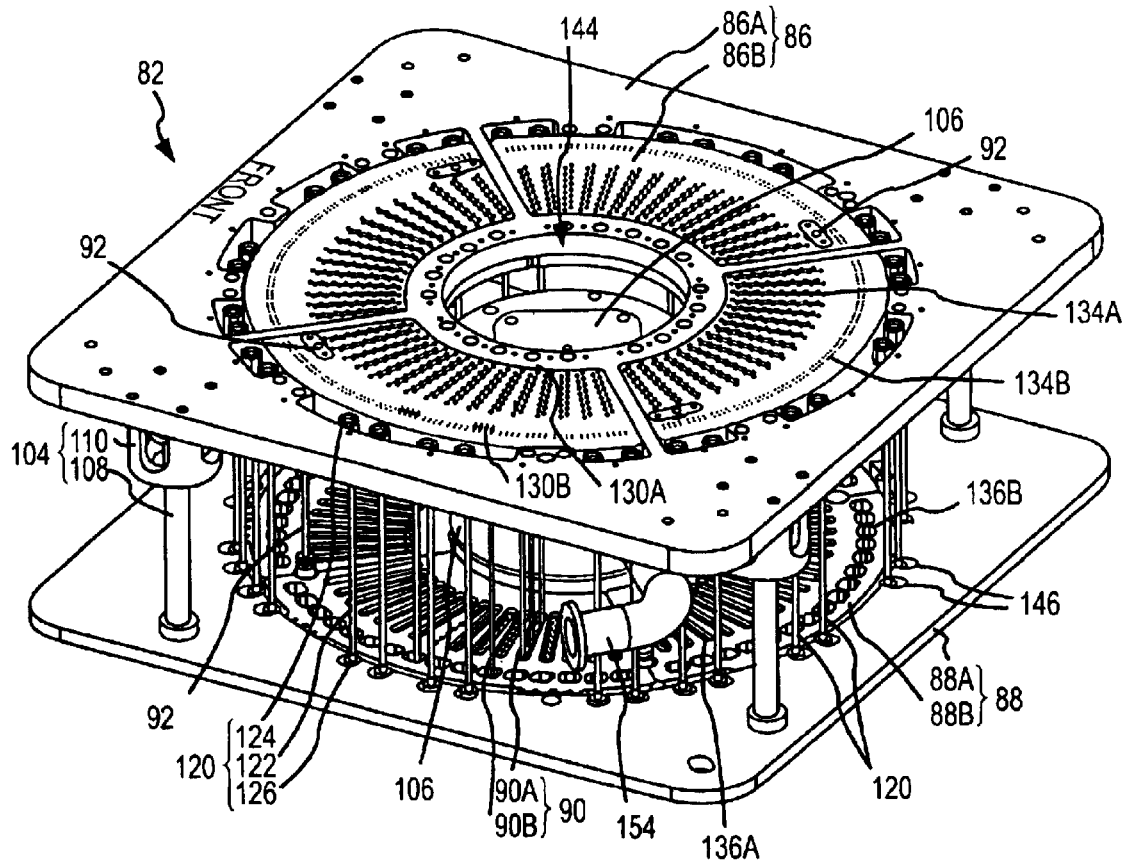
FIG. 6 is a perspective vice of the interface module, excluding most of the module's electrical cables, of FIG. 5.
Figure 7:
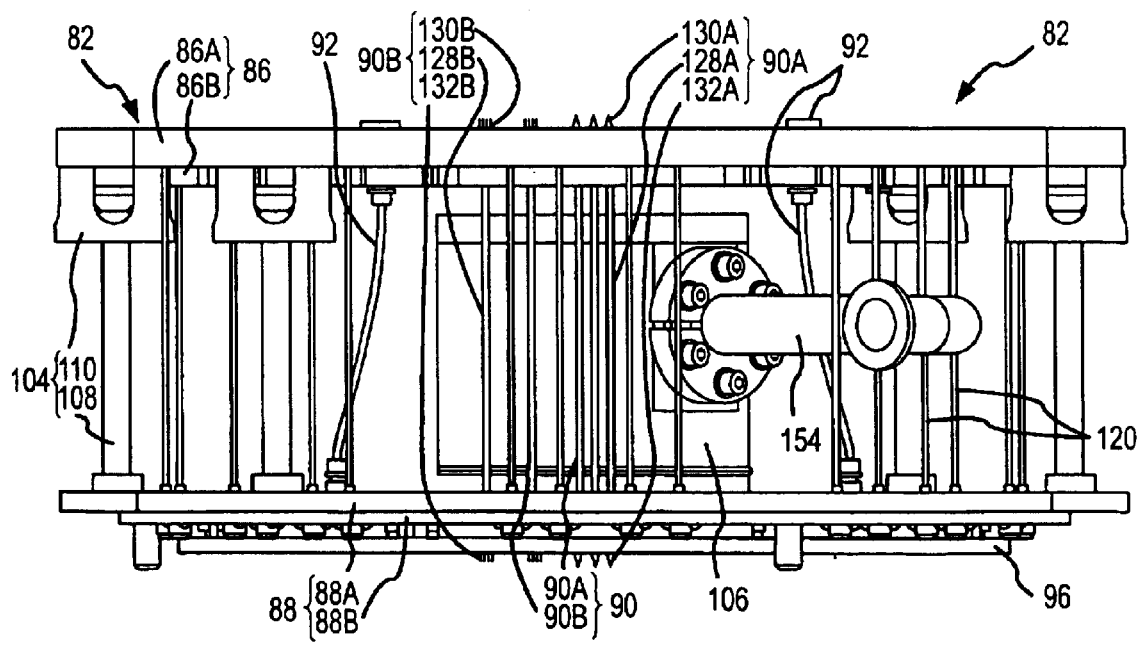
FIG. 7 is a cross-sectional side view of the interface module, again excluding most of the module's electrical cables, of FIG. 5.
Figure 8:
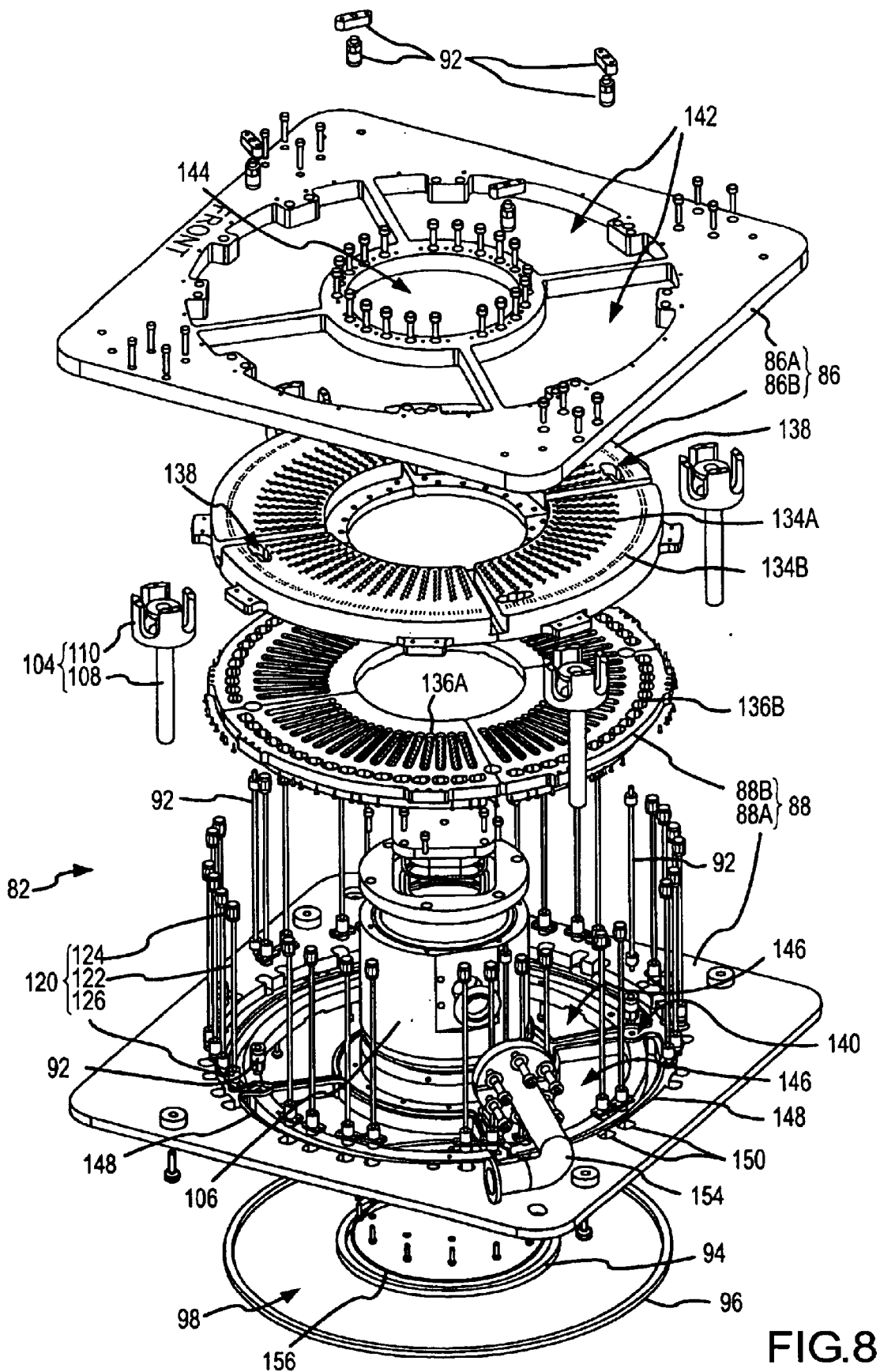
FIG. 8 is an exploded perspective view of the interface module, once again excluding most of the module's electrical cables, of FIG. 5.

FIG. 6 is another general perspective view of interface module 82 except that only a few of electrical cables 90 are depicted in the figure in order to present details of the areas where cables 90 enter bodies 86 and 88. FIG. 7 is a side view of module 82 that matches FIG. 6 in illustration complexity. That is, only a few of cables 90 are depicted in FIG. 7. FIG. 8 is an exploded view of module 82 except that none of cables 90 appears in FIG. 8. All of additional electrical cables 120 appear in FIGS. 6–8. While cables 90 and 120 are normally somewhat bent during test operation, FIGS. 6–8 depict cables 90 and 126 at their full extensions for illustration simplicity.

Additional electrical cables 120 are subminiature modular blind ("SMB") high-frequency signal/ground co-axial cables configured somewhat differently than electrical cables 90. Each SMB cable 120 consists of a main cable 122, a tester-side snap-on connector 124, and a device-side snap-on connector 126. See FIGS. 6–8. Tester-side connectors 124 extend through openings in tester-side body 86 and respectively mate with tester snap-on connectors (not shown) that extend downward from the test surface of test head 16 and respectively pass through openings in adapter board 80 (not shown in FIGS. 5–8). Device-side connectors 126 similarly extend through openings in device-side body 88 and respectively mate with snap-on connectors (not shown) that extend upward from load board 62 (likewise not shown in FIGS. 5–8). As indicated in FIG. 8, device-side connectors 126 are flange mounted on body 88. Cables 120 are typically rated at 50 ohms and can carry signals at frequencies typically up to approximately 30 GHz.

Additional cables 120 are sufficiently flexible to substantially prevent vibrations in tester-side structure 80/84/86 from being transferred through cables 120 to device-side body 88. As a result, cables 120 function in the same way as electrical cables 90 and vacuum hose system 92 to isolate probe system 64 from vibrations that occur in test head 16. Vibration isolation system 90/92 in the version of interface apparatus 66 shown in FIGS. 3b and 4b becomes a vibration isolation system 90/92/120 in the embodiment of interface module 82 in FIGS. 5–8.

Electrical cables 90 here consist of signal/ground co-axial cables 90A and utility cables 90B. Signal/ground cables 90A are arranged in sixty-four banks, each containing sixteen cables 90A, for a total of 1024 cables 90A. Utility cables 90B are arranged in sixty-four banks, each containing eight cables 90B, for a total of 512 cables 90B. To the extent that cables 90B appear in FIG. 5, only one cable 90B in each bank of eight cables 90B is, for simplicity, illustrated in FIG. 5. Utility cables 90B are situated laterally around signals/ground cables 90A.

Signal/ground cables 90A carry digital or/and analog test signals and provide ground reference. For example, cables 90A typically carry up to 1024 digital test signals and provide digital ground for digital signal transmission. Each signal/ground cable 90A consists of a main signal/ground cable 128A, a tester-side spring-loaded probe 130A, and a device-side spring-loaded probe 132A. See FIG. 7. Portions 128A and 130A of each cable 90A extend through an opening 134A in tester-side body 86. Portions 128A and 132A of each cable 90A extend through an opening 136A in device-side body 88. See FIGS. 5, 6, and 8. Cables 90A are typically rated at 50 ohm and can carry signals at frequencies typically up to 3–4 GHz. Further information on cables 90A is presented below in connection with FIGS. 10 and 11.

Utility cables 90B provide various utility functions such as power transmission and control. Cables 90B can also carry analog signals. Most of cables 90B are uniaxial cables suitable for power transmission. A few, typically 4–6, of cables 90B are co-axial cables that can provide more functions than power transmission. Each utility cable 90B consists of a main utility cable 128B, a tester-side spring-loaded probe 130B, and a device-side spring-loaded probe 132B. See FIG. 7. Portions 128B and 130B of each cable 90B extend through an opening 134B in tester-side body 86. See FIGS. 5, 6, and 8. Cables 90B extend in groups of eight into recessions 136B in device-side body 88. Portions 128B and 132B of each cable 90B then extend through an opening (not visible in any of FIGS. 5–8) at the bottom of one of recessions 136B.

Vacuum hose system 92 in the embodiment of FIGS. 5–8 consists of four combinations of a vacuum hose and associated fittings. As shown in FIG. 8, each hose/fitting combination passes through an opening 138 in tester-side body 86 and through an opening 140 in device-side body 88.

Tester-side body 86 is formed with a generally square metallic tester-side stiffener plate 86A and a circular metallic tester-side cable-receiving assembly. Referring to FIG. 8, the tester-side assembly consists of four truncated wedge-shaped sections 86B that respectively fit into four truncated wedge-shaped openings 142 extending through tester-side stiffener plate 86A. Wedge-shaped sections 86B are separate from, but adjacent to, one another. Electrical cables 120 pass through openings 142 beyond the lateral periphery of the tester-side assembly, also identified by reference symbol 86B.

Tester-side assembly 86B contains openings 134A and openings 134B through which signal/ground cables 90A and utility cables 90B respectively extend. See FIG. 8. Assembly 86B also has openings 138 through which the hose/fitting combinations of vacuum hose system 92 extend. An opening 144 extends through the center of stiffener plate 86A.

Device-side body 88 is formed with a generally square metallic device-side stiffener plate 88A and a circular metallic device-side cable-receiving assembly. As depicted in FIG. 8, the device-side assembly consists of four truncated wedge-shaped sections 88B that respectively fit into four truncated wedge-shaped openings 146 extending through stiffener plate 88A. Wedge-shaped sections 88B are separate from, but adjacent to, one another. Each wedge shaped section 88B is substantially identical to, but inverted relative to, each wedge-shaped section 86B of the tester-side assembly. Four rubber O rings 148 extend respectively along wedge-shaped openings 146 for hermetically sealing the device-side assembly, also identified by reference symbol 88B, to stiffener plate 88A. Stiffener plate 88A has openings 140 through which the hose/fitting combinations of vacuum hose system 92 extends.

Device-side assembly 88B has openings 136A and 136B into which signal/ground cables 90A and utility cables 90B respectively extend. Additional cables 120 pass through openings 150 in device-side stiffener plate 88A. See FIGS. 6 and 8. A circular opening (not visible in any of FIGS. 5–8) passes through the center of stiffener plate 88A.

Vacuum chamber 106 is situated above the preceding opening through the center of stiffener plate 88A. Chamber 106, which is generally cylindrical in shape with a closed top, consists of various metallic components and rubber O rings. A high vacuum, normally furnished from probe system 64, is provided in chamber 106 by way of an elbow-shaped metallic port 154 connected to chamber 106 along its outer cylindrical periphery. The vacuum provided in sealed-enclosure 112 (not indicated in FIGS. 5–8) is extended down to load board 62 (likewise not indicated in FIGS. 5–8) by a rubber O ring 156 situated below device-side assembly 86B just inside inner vacuum seal 94.

Figure 9:
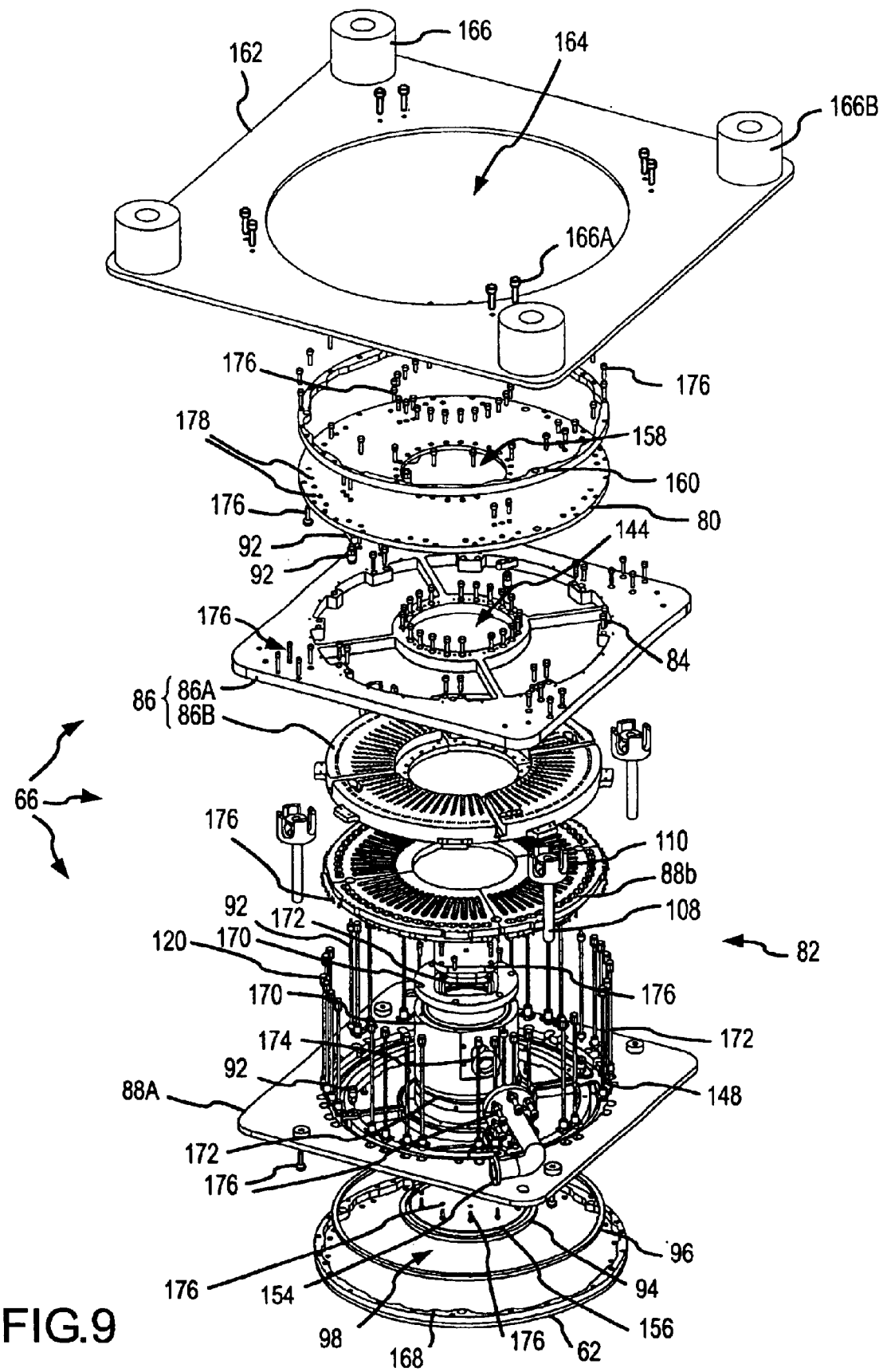
FIG. 9 is an exploded perspective view of the combination of a load board, an adapter board, and the interface module, again excluding most of the module's electrical cables, of FIG. 5.

FIG. 9 presents an exploded view of an embodiment of all of interface apparatus 66 for the test-system interface configuration of FIG. 4b. Interface module 82 in FIG. 9 is configured the same as in the embodiment of FIGS. 5–8. As indicated in FIG. 9, adapter board 80 is generally circular in shape. A circular opening 158 of largely the same diameter as opening 144 in device-side body 86 extends through the center of board 80. Openings 144 and 158 facilitate assembly and modification of interface apparatus 66. Board 80 includes a circular metallic stiffener ring 160 situated along the board's outer periphery.

Interface apparatus 66 preferably docks to test head 16 by way of an optional generally square metallic docking plate 162 having a circular opening 164 into which adapter board 80 is inserted. Opening 164 is of slightly greater diameter than board 80. When present, docking plate 162 is mechanically attached to stiffener plate 86A of apparatus 66 through eight screws 166A. Docking plate 162 is also mechanically attached to head 16 through four connectors 166B so that apparatus 66 is mechanically attached to head 16. Docking plate 162 augments the vacuum attachment of apparatus 66 to head 16. This reduces the likelihood that external forces exerted on the test system can overcome the vacuum provided by head 16 in region 72 and cause apparatus 66 to separate from head 16.

Load board 62 is generally circular in shape. A large circular opening (not indicated in FIG. 9) extends through the center of board 62. Board 62 includes a circular metallic stiffener ring 168 situated along the outer board periphery.

Items 170 in FIG. 9 indicate various metallic components of vacuum chamber 106. Items 172 are rubber O rings employed in chamber 106. Item 174 is a vacuum seal through which chamber 106 is sealed to vacuum port 154. Items 176 indicate various attachment hardware, e.g., bolts, screws, and washers, aside from attachment hardware 84, for mechanically interconnecting various parts of interface apparatus 66. Finally, items 178 indicate the openings by which the snap-on connectors extending from the test surface of test head 16 pass through adapter board 80 to mate with snap-on connectors 124 (not separately labeled in FIG. 9) of additional cables 120.

Device-side stiffener plate 86A, device-side assembly 86B, tester-side stiffener plate 88A, tester-side assembly 88B, posts 108, flanges 110, stiffener ring 160, stiffener ring 168, and the metallic components of vacuum chamber 106 typically consist of aluminum alloy. Vacuum port 154 consists of stainless steel. The outside diameter of assemblies 86B and 88B is 34.3 cm. The diameter of opening 144 through stiffener plate 86A is 10.5 cm. With electrical cables 90 and 120 fully extended, the distance between tester-side body 86 and device-side body 88 is approximately 18 cm.

Figure 10:
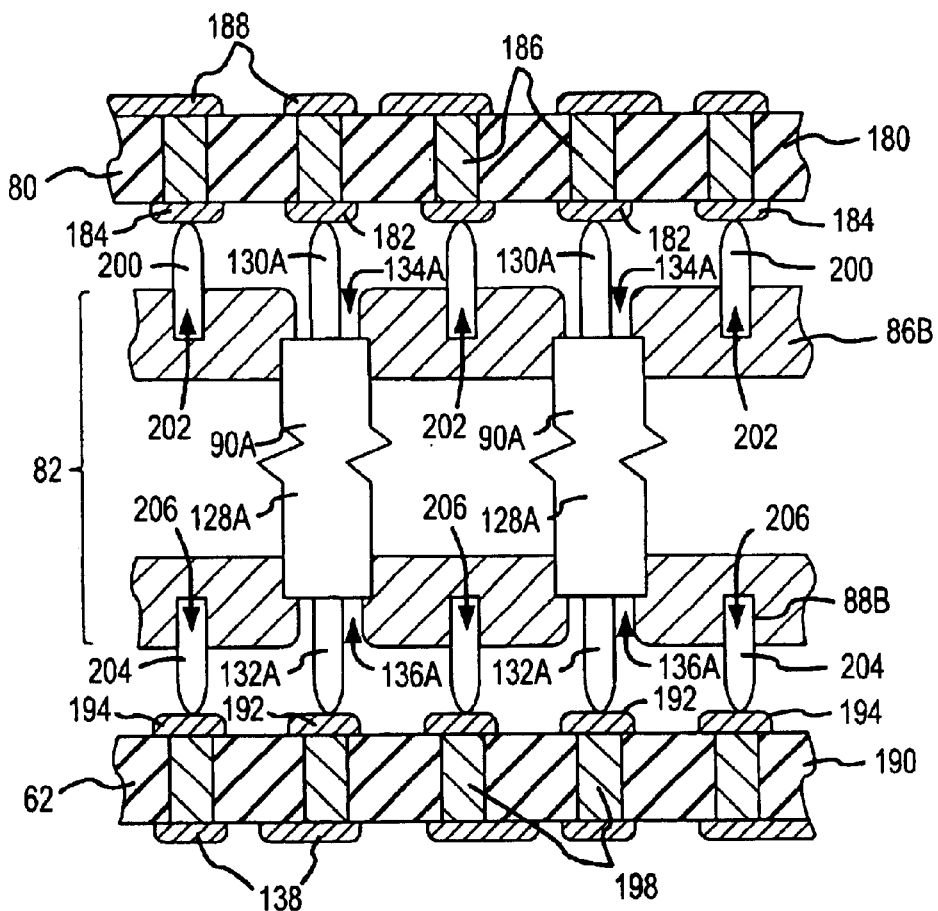
FIG. 10 is a schematic cross-sectional view of part of the load board, adapter board, and interface module of FIG. 5.

FIG. 10 presents a side cross section of part of interface module 82 for schematically illustrating how electrical cables 90A electrically contact adapter board 80 and load board 62. Boards 62 and 80 are illustrated very simplistically in FIG. 10. Each board 62 or 80 is normally a multi-layer board having electrically conductive traces buried in the board rather than a single-layer board as depicted in FIG. 10. As a result, many of the metal interconnects shown as going fully through board 62 or 80 go only partway through board 62 or 80 when it is a multi-layer board. Each board 62 or 80 also typically has some metal interconnects fully buried in the board. Furthermore, each via illustrated in FIG. 10 may only be partially filled with metal instead of being fully filled with metal as shown in FIG. 10.

Subject to the foregoing comments, simplified adapter board 80 in FIG. 10 consists of an electrically insulating main adapter board 180, multiple tester signal contacts 182 situated along the bottom of main board 180, multiple tester ground contacts 184 likewise situated along the bottom of board 180, multiple metal interconnects 186 situated in vias extending through board 180, and electrically conductive traces 188 situated on top of board 180. Contacts 182 and 184 are metal pads respectively electrically connected to metal interconnects 186 which, in turn, are connected to conductive traces 188.

Subject to the same comments, simplified load board 62 in FIG. 10 consists of an electrically insulating main load board 190, multiple device-side signal contacts 192 situated along the top of main board 190, multiple device-side ground contacts 194 also situated along the top of board 190, multiple metal interconnects 196 situated in vias extending through board 190, and electrically conductive traces 198 situated on the bottom of board 190. Contacts 192 and 194 are metal pads respectively electrically connected to metal interconnects 196 which, in turn, are connected to conductive traces 198.

Tester-side probes 130A are metal pins that respectively extend out of openings 134A in tester-side assembly 86B to electrically contact tester signal contacts 182. Similarly, device-side probes 132A are metal pins that respectively extend out of openings 136A in device-side assembly 88B to electrically contact device-side signal contacts 192. In addition, tester-side metal pins 200 respectively extend out of ground openings 202 in tester-side assembly 86B to electrically contact tester ground contacts 184. Device-side metal pins 204 similarly respectively extend out of ground openings 206 of device-side assembly 88B to electrically contact device-side ground contacts 194.

Figure 11:
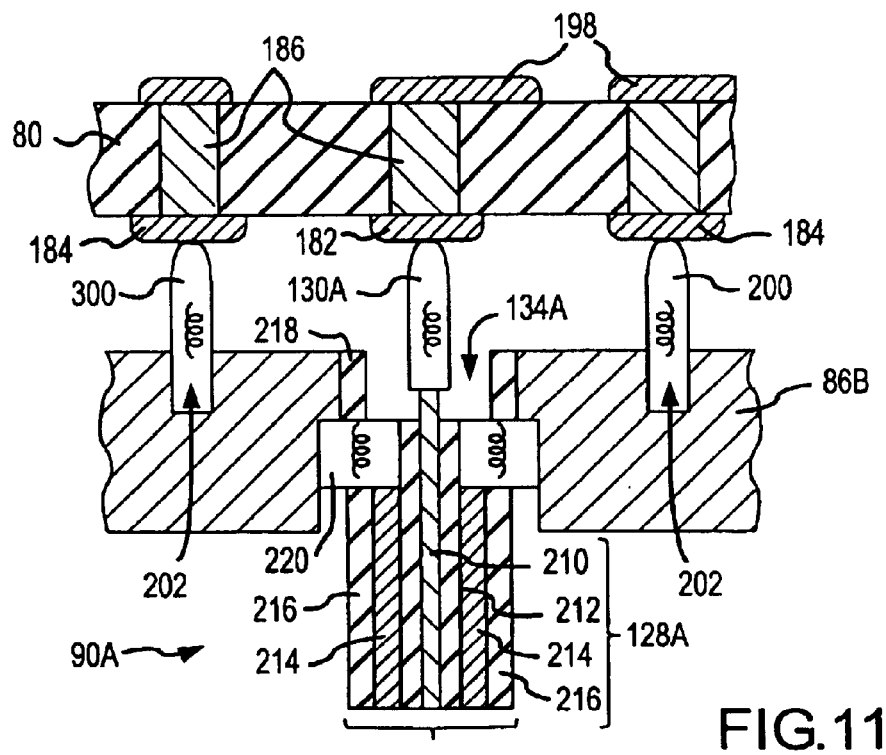
FIG. 11 is a schematic cross-sectional view of part of one interface cable as it passes through the interface module of FIG. 5.

FIG. 11 presents a more detailed schematic cross section of how one electrical cable 90A is typically generally implemented to pass through an opening 134A of tester-side assembly 86B and electrically contact a tester signal contact 182 of adapter board 80 illustrated here in the simplistic form utilized in FIG. 10. In this general implementation, main cable 128A of illustrated cable 90A is a coaxial cable formed with an inner metal signal conductor 210, intermediate annular electrical insulation 212 situated over signal conductor 210, an outer annular metal ground conductor 214 situated over insulation 212, and outer electrical insulation 216 situated over ground conductor 214. Tester-side probe 130A, which electrically contacts illustrated tester contact 182, is a spring-loaded contact that also electrically contacts signal conductor 210. Item 218 in FIG. 11 indicates further electrical insulation which prevents tester-side probe 130A from being electrically connected to metallic tester-side assembly 86B.

Main cable 128A in the implementation of FIG. 11 also includes a spring-loaded contact 220 which electrically connects ground conductor 214 to metallic tester-side assembly 86B. Each tester-side digital-ground pin 200 is a spring-loaded contact in the implementation of FIG. 11.

Ground conductor 214 carries a ground reference potential. By employing the arrangement of FIG. 11, the ground potential on ground conductor 214 is transferred through spring-loaded contact 220, assembly 86B, and spring-loaded pins 200 to a ground contact 184 of adapter board 80. An arrangement largely identical to that of FIG. 11 is typically utilized on the other end of electrical cable 90A for electrically connecting signal conductor 210 and ground conductor 214 respectively to a device-side signal contact 192 and a ground device-side ground contact 194 of load board 62.

Figure 12:
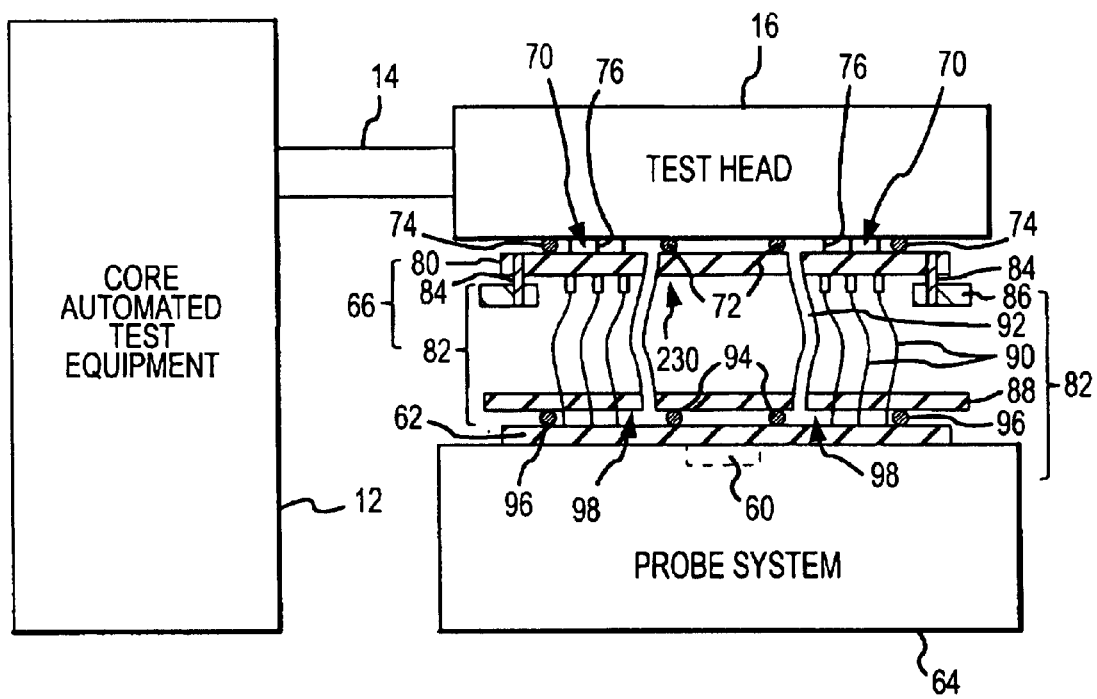
FIG. 12 is a composite block diagram/cross-sectional view of the interface configuration of another test system arranged according to the invention.

FIG. 12 illustrates the interface configuration of another test system arranged in accordance with the invention for testing or/and examining unit 60 of an electronic device, again typically an IC. The test system having the interface configuration of FIG. 12 has the test-system direct configuration generally shown in FIG. 3a and described above. The test-system interface configuration of FIG. 12 is identical to the test-system interface configuration of FIG. 3b except that adapter board 80, tester-side body 86, and primary electrical cables 90 are configured differently in the interface configuration of FIG. 12 than in that of FIG. 3b. Vacuum hose system 92 is also positioned differently in the interface configuration of FIG. 12 than in that of FIG. 3b. Aside from the changes caused by these differences, the interface configuration of FIG. 12 is employed and operates the same as the interface configuration of FIG. 3b.

In the interface configuration of FIG. 12, all of electrical cables 90 pass through a large opening 230 in tester-side body 86. The upper ends of cables 90 plug into adapter board 80 so as to be connected to the electrically conductive traces (not separately shown here) along the lower surface of board 80. The lower ends of cables 90 in the interface configuration of FIG. 12 are arranged the same as in that of FIG. 3a. Hence, each cable 90 again flexibly connects device-side body 88 to tester-side structure 80/84/86. The resulting vibration isolation system 90/92 formed with cables 90 and vacuum hose system 92 largely prevents vibrations in test head 16 from being transmitted to probe system 64 in substantially the same way described above for the interface configuration of FIG. 3a.

Vacuum-hose system 92 also passes through opening 230 in tester-side body 86 in the interface configuration of FIG. 12. In contrast to the interface configuration of FIG. 3b where system 92 is situated laterally around electrical cables 90, cables 90 are situated laterally around system 92 in the interface configuration of FIG. 12.

Figure 13:
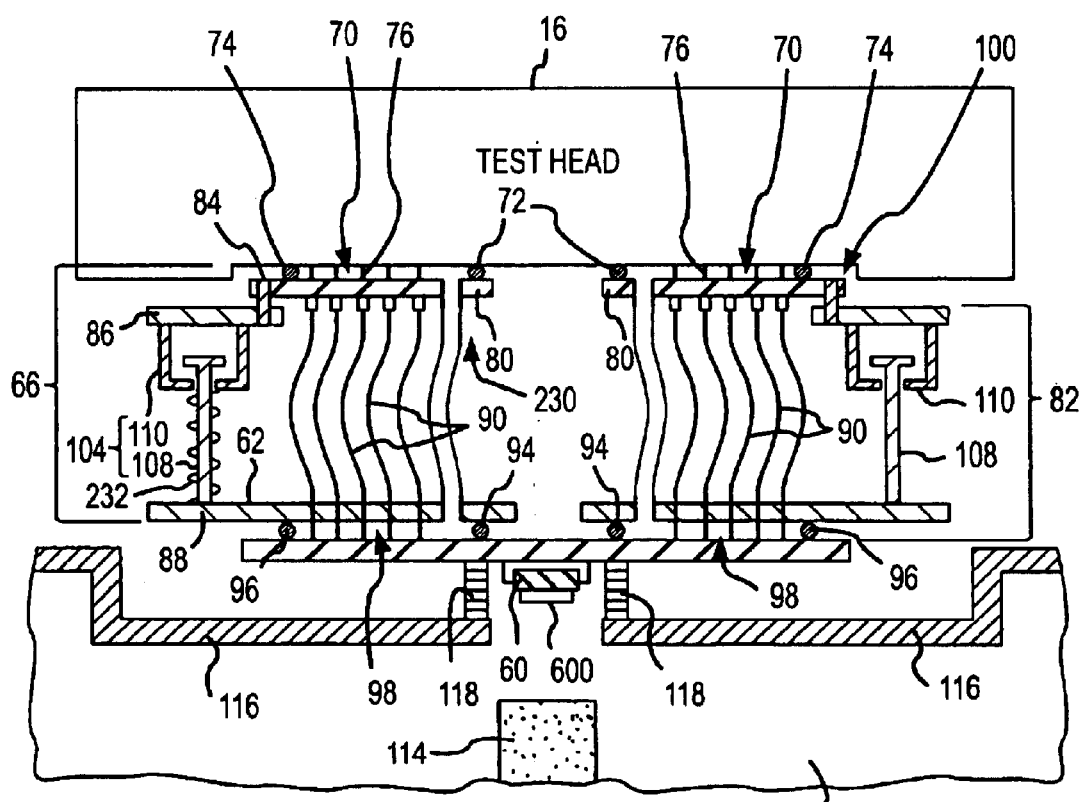
FIG. 13 is a composite block diagram/cross-sectional view of part of an implementation of the test-system interface configuration of FIG. 12.

FIG. 13 illustrates part of an implementation of the test-system interface configuration of FIG. 12. Vacuum chamber 106 is not provided in the interface-configuration implementation of FIG. 13. A spring may optionally be placed around each of posts 108 of movement-restricting mechanism 104 to help support the weight of tester-side structure 80/84/86. Dashed-line item 232 in FIG. 13 indicates one such optional spring. Aside from the optional use of springs around posts 104, the absence of vacuum chamber 106, the changed location of vacuum hose system 92, and the above-indicated changes in the configurations of adapter board 80, tester-side body 86, and electrical cables 90, the interface-configuration implementation of FIG. 13 is the same as that of FIG. 4b.

Figure 14:
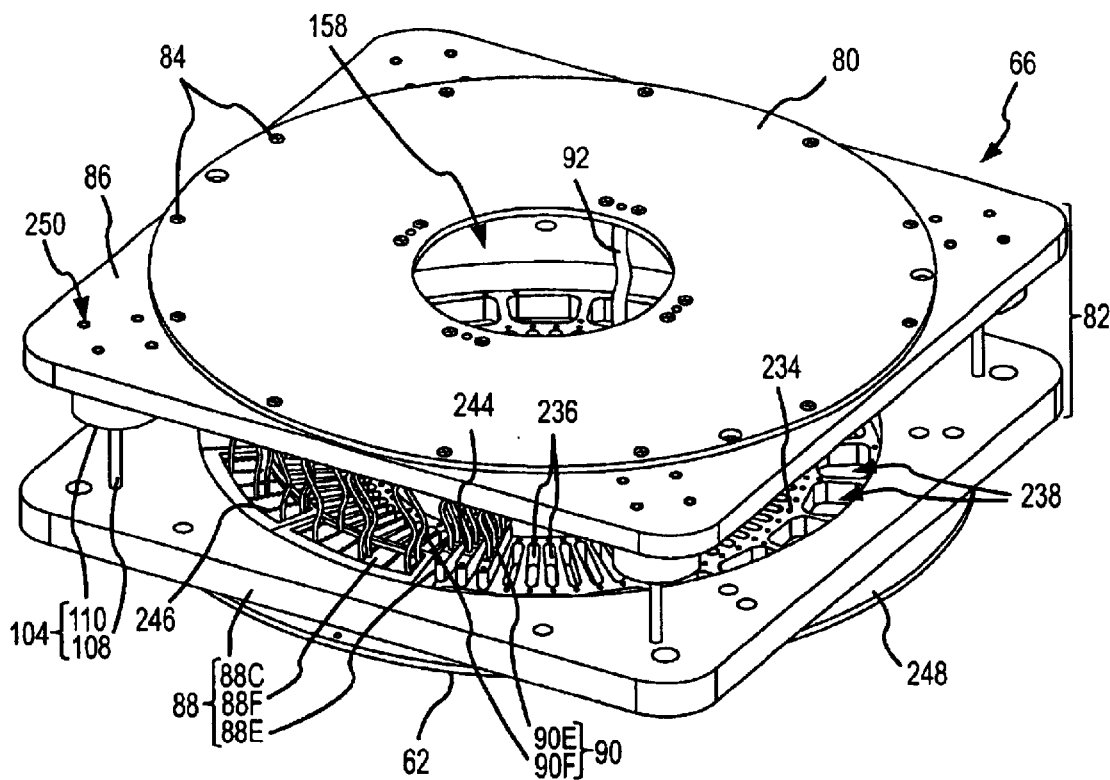
FIG. 14 is a perspective view of a load board, an adapter board, and an interface module, excluding part of the module's electrical cables, configured according to the invention for use in the test-system interface configuration of FIG. 13.
Figure 15:
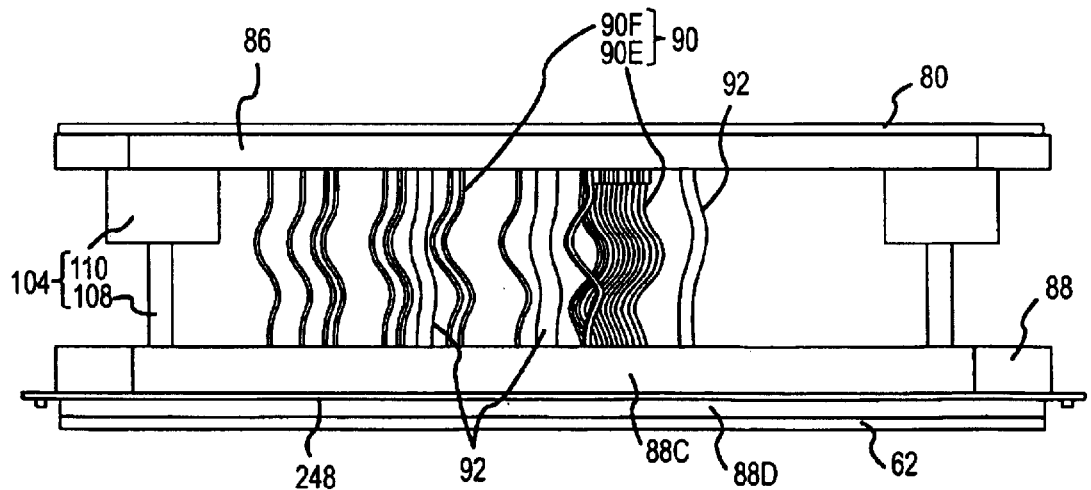
FIG. 15 is a cross-sectional side view of the load board, adapter board, and interface module, again excluding part of the module's electrical cables, of FIG. 14.
Figure 16:
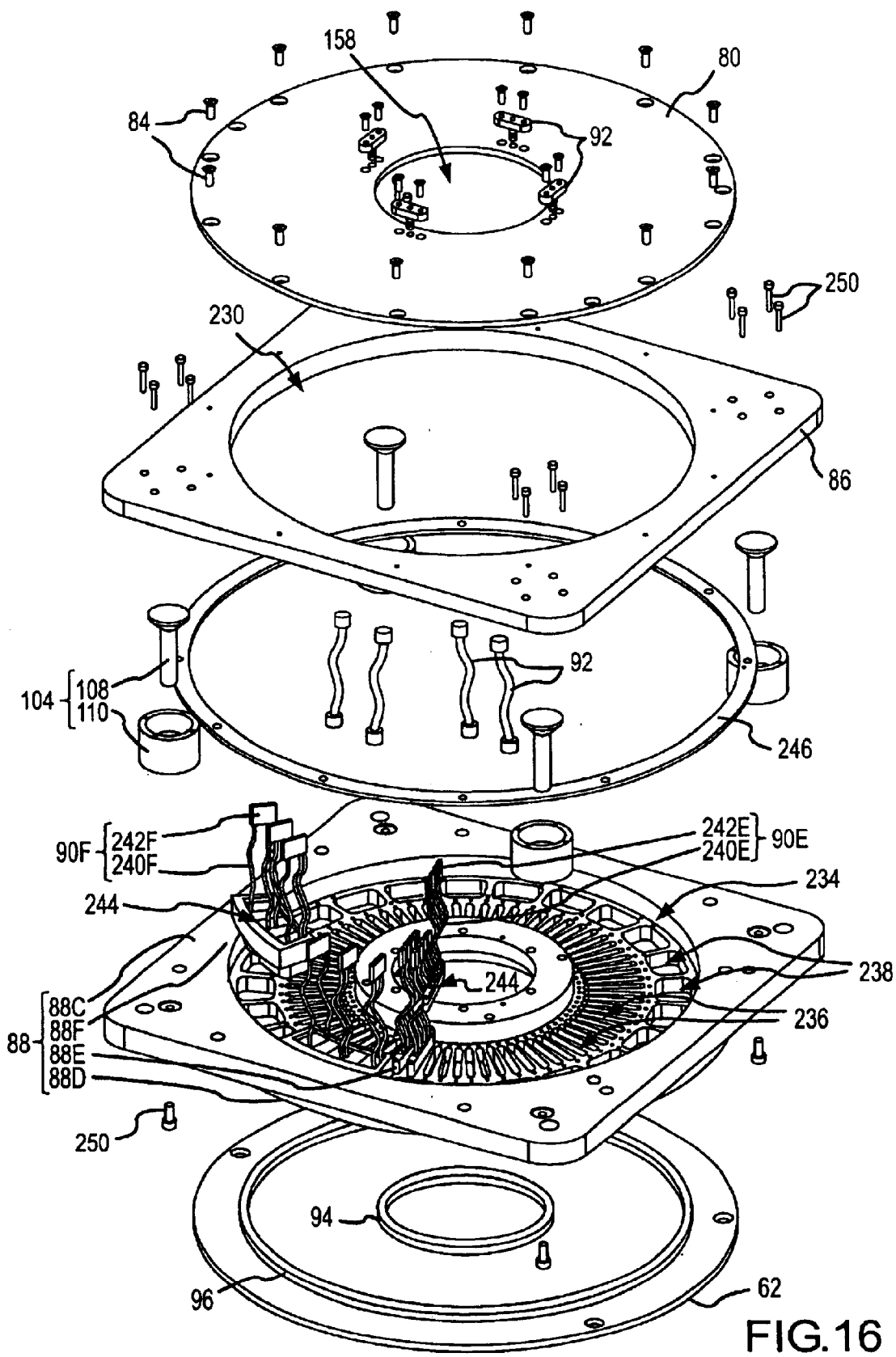
FIG. 16 is an exploded perspective view of the load board, adapter board, and interface module, once again excluding part of the module's electrical cables, of FIG. 14.

FIGS. 14–16 present various views of an embodiment of load board 62 and interface apparatus 66 for the test-system interface configuration of FIG. 13, where apparatus 66 again consists of adapter board 80 and interface module 82. Apparatus 66 in FIGS. 14–16 enables the DUT to have up to at least 512 leads for transmitting digital or/and analog signals. For example, the DUT can have up to 512 leads for transmitting digital signals and additional leads for transmitting analog signals.

FIG. 14 is a perspective view. FIGS. 15 and 16 are respective side and exploded views that largely match FIG. 14 in illustration detail. To facilitate illustrating internal details of interface apparatus 66, only part of electrical cables 90 are depicted in each of FIGS. 14–16.

In the interface-configuration embodiment of FIGS. 14–16, tester-side board 86 is a generally square metallic plate having opening 230. Device-side body 88 is formed with a generally square metallic stiffener plate 88C, an underlying circular metallic plate 88D, seventy-two elongated sections 88E, and twelve truncated wedge-shaped sections 88F. See FIGS. 14 and 16. Only a few of elongated sections 88E and wedge-shaped sections 88F are depicted in FIGS. 14 and 16.

Elongated sections 88E and wedge-shaped sections 88F are situated in a large opening 234 extending through stiffener plate 88C. Elongated sections 88E are arranged in a generally circular pattern. Each section 88E fits into an opening 236 extending through circular plate 88D. Wedge-shaped sections 88F are arranged in a generally circular pattern and situated laterally around elongated sections 88E. Each wedge-shaped section 88F has a pair of lower segments that respectively extend through a pair of openings 238 in plate 88D. Sections 88E and 88F are hermetically sealed to plate 88D through rubber O rings (not visible in any of FIGS. 14–16).

Electrical cables 90 in the embodiment of FIGS. 14–16 consist of signal/ground co-axial cables 90E and utility cables 90F. Signal/ground cables 90E are normally arranged in sixty-four banks, each containing eight cables 90E, for a total of 512 cables 90E. Utility cables 90F are arranged in seventy-two banks, each containing seven cables 90F, for a total of 504 cables 90F. Utility cables 90F are situated laterally around signal/ground cables 90E.

Signal/ground cables 90E carry digital or/and analog signals, e.g., up to 512 digital test signals, and provide ground reference, especially digital ground for digital-signal transmission. Each cable 90E consists of a main signal/ground cable 240E, a tester-side plug connector 242E and a device-side spring-loaded probe (not visible in any of FIGS. 14–16). See FIG. 16. Plug connector 242E of each cable 90E passes through opening 230 in tester-side body 86 and plugs into a receptacle (not visible in any of FIGS. 14–16) along the bottom of adapter board 80.

Eight cable-receiving openings 244 extend through each of elongated portions 88E of device-side body 88. Main cable 240E and the spring-loaded probe of each signal/ground cable 90E extend through a corresponding one of cable-receiving openings 244 in one of elongated sections 88E. All of openings 244 in sixty-four of the seventy-two elongated sections 88E receive cables 90E in this way. Openings 244 in each of the remaining eight elongated sections 88E, typically two in each quadrant, are generally left vacant. Nonetheless, depending on the capabilities of test head 16 and adapter board 80, interface apparatus 66 can be provided with additional cables 90E that plug into board 80 and pass through openings 244 in the remaining eight elongated sections 88E.

Utility cables 90F provide various utility functions such as power transmission and control. Cables 90F can also provide an analog capability. Each cable 90F consists of a main utility cable 240F, part of a multi-cable tester-side connector 242F, and a device-side spring-loaded probe (not visible in any of FIGS. 14–16). Referring to FIG. 16, each connector 242F terminates main cable 240F of seven cables 90F in a corresponding one of the banks of cables 90F. Forty-two cable-receiving openings 246, arranged in six banks of seven openings 246 per bank, extend through each wedge-shaped section 88F of tester-side body 88. Main cable 240F and the spring-loaded probe of each cable 90F extend through a corresponding one of openings 246 in one of wedge-shaped sections 88F.

Item 248 in FIGS. 14–16 is an optional optical spacing ring provided along the bottom of stiffener plate 86C for adjusting the spacing between device unit 60 and probe system 64 when system 64 is implemented with an optical probe. Items 250 indicate various attachment hardware such as screws and bolts.

While the invention has been described with reference to particular embodiments, this description is solely for the purpose of illustration and is not to be construed as limiting the scope of the invention claimed below. For instance, the vacuum for attaching load board 62 to interface apparatus 66 and for attaching apparatus 66 to test head 16 in the interface configuration can be provided by a separate vacuum pump rather than through head 16. Various modifications and applications may thus be made by those skilled in the art without departing from the true scope of the invention as defined in the appended claims.

We claim:

1. A test system for testing units of an electronic device, the test system comprising:
    at least one test head;
    at least one load board for receiving a unit of the electronic device, each load board having a pattern of test-head signal transmission positions largely identical to the pattern of test-head signal transmission positions of each other, if any other, load board;
    a probe system having a probe; and
    an interface apparatus, the test system being deployable (a) in a direct configuration in which one such load board is directly attached to one such test head for transmitting test signals through that load board's test-head signal transmission positions and (b) in an interface configuration in which one such load board is coupled through the interface apparatus to one such test head for transmitting test signals through that load board's test-head signal transmission positions, in which the probe system contacts the interface apparatus or/and load board, and in which the interface apparatus is configured to largely prevent vibrations in that test head from being transferred through the interface apparatus to the probe system.

2. A test system as in claim 1 wherein the interface apparatus comprises:
    a tester-side structure for attachment to the test head used in interface configuration;
    a device-side body for attachment to the load board used in interface configuration; and
    an isolation system for flexibly connecting the tester-side structure to the device-side body while largely preventing vibrations in the tester-side structure from being transmitted through the isolation system to the device-side body.

3. A test system as in claim 2 wherein the isolation system comprises multiple flexible electrical cables.

4. A test system as in claim 3 wherein the electrical cables extend largely from at least the tester-side structure to at least the device-side body.

5. A test system as in claim 3 wherein the electrical cables carry electrical signals that pass between the tester-side structure and the load board used in interface configuration.

6. A test system as in claim 4 wherein the isolation system includes a flexible hose system extending largely from at least the tester-side structure to at least the device-side body for attaching the load board used in interface configuration to the interface apparatus by way of a substantial vacuum.

7. A test system as in claim 2 wherein the interface apparatus further includes a movement-restricting mechanism for limiting the movement of the device-side body relative to the tester-side structure while largely avoiding transferring vibrations in the tester-side structure through the movement-restricting mechanism to the device-side body.

8. A test system as in claim 7 wherein the movement-restricting mechanism comprises at least one combination of a post and a flange, the post being mounted on one of the tester-side structure and the device side body, the flange being mounted on the other of the tester-side structure and the device-side body, the flange having an opening through which the post extends and which is of greater diameter than the post where it extends through that opening.

9. A test system as in claim 2 wherein the tester-side structure comprises:
    an adapter board for attachment to the test head used in interface configuration; and
    a tester-side body connected to the adapter board and the isolation system.

10. A test system as in claim 9 wherein electrical signals pass through the adapter board.

11. A test system as in claim 9 wherein the isolation system comprises multiple electrical cables which pass through at least one opening in the tester-side body to contact the adapter board and which pass through openings in the device-side body for contacting the load board used in interface configuration.

12. A test system as in claim 11 wherein the cables pass through multiple openings in the tester-side body.

13. A test system as in claim 1 wherein, in the direct configuration:
    test signals are provided from the test head used in the direct configuration to the load board used in the direct configuration for testing a unit of the electronic device; and
    test signals are provided from that load board to that test head in response to test signals provided from that unit of the electronic device to that load board.

14. A test system as in claim 13 wherein, in the interface configuration:
    test signals are provided from the interface apparatus to the load board used in the interface configuration for testing a unit of the electronic device in response to test signals provided from the test head used in the interface configuration to the interface apparatus; and
    test signals are provided from the interface apparatus to that test head in response to test signals which are provided from that load board to the interface apparatus in response to test signals provided from that unit of the electronic device to that load board.

15. A test system as in claim 1 wherein, in the interface configuration, the load board used in the interface configuration is attached by a substantial vacuum to the interface apparatus.

16. A test system as in claim 15 wherein, in the interface configuration, the interface apparatus is attached by a substantial vacuum to the test head used in the interface configuration.

17. A test system as in claim 1 wherein the probe is a substantially non-intrusive probe.

18. A test system as in claim 17 wherein the probe is an optical probe.

19. A test system as in claim 17 wherein the probe is an electron-beam probe.

20. A test system as in claim 1 wherein the probe is an intrusive probe.

21. A test system for testing units of an electronic device, the test system comprising:
   at least one test head;
   at least one load board for receiving a unit of the electronic device, each load board having a pattern of test-head signal transmission positions largely identical to the pattern of test-head signal transmission positions of each other, if any other, load board;
   a probe system having a probe; and
   an interface apparatus, the test system being deployable (a) in a direct configuration in which one such load board is directly attached to one such test head for transmitting test signals through that load board's test-head signal transmission positions and (b) in an interface configuration in which one such load board is attached by a substantial vacuum to the interface apparatus, in which that load board is coupled through the interface apparatus to one such test head for transmitting test signals through that load board's test-head signal transmission positions, and in which the probe system contacts the interface apparatus or/and that load board.

22. A test system as in claim 21 wherein the vacuum is provided through the test head used in the interface configuration.

23. A test system as in claim 21 wherein, in the interface configuration, the interface apparatus is attached by a substantial vacuum to the test head used in the interface configuration.

24. A test system as in claim 23 wherein the vacuums are provided through the test head used in the interface configuration.

25. A test system as in claim 23 wherein, in the interface configuration, the interface apparatus is also mechanically attached to the test head used in the interface configuration.

26. A test system as in claim 21 wherein, in the interface configuration, the interface apparatus is mechanically attached to the test head used in the interface configuration.

27. A test system as in claim 21 wherein, in the direct configuration, the load board used in the direct configuration is attached by a substantial vacuum to the test head used in the direct configuration.

28. A test system as in claim 27 wherein:
   the vacuum used in the direct configuration is provided through the test head used in the direct configuration; and
   the vacuum used in the interface configuration is provided through the test head used in the interface configuration.

29. A test system as in claim 21 wherein the interface apparatus comprises:
   a tester-side structure for attachment to the test head used in the interface configuration;
   a device-side body for attachment to the load board used in the interface configuration; and
   a hose system extending from at least the tester-side structure to at least the device-side body for providing the vacuum that attaches the load board used in the interface configuration to the interface apparatus.

30. A test system as in claim 29 wherein the interface apparatus includes multiple electrical cables which carry electrical signals that pass between the tester-side structure and the load board used in the interface configuration.

31. A test system as in claim 21 wherein the interface apparatus comprises:
   an adapter board for attachment to the test head used in the interface configuration; and
   an interface module that couples the probe system to the adapter board.

32. A test system as in claim 31 wherein electrical signals pass through the adapter board.

33. A test system as in claim 21 wherein, in the direct configuration:
   test signals are provided from the test head used in the direct configuration to the load board used in the direct configuration for testing a unit of the electronic device; and
   test signals are provided from that load board to that test head in response to test signals provided from that unit of the electronic device to that load board.

34. A test system as in claim 33 wherein, in the interface configuration:
   test signals are provided from the interface apparatus to the load board used in the interface configuration for testing a unit of the electronic device in response to test signals provided from the test head used in the interface configuration to the interface apparatus; and
   test signals are provided from the interface apparatus to that test head in response to test signals which are provided from that load board to the interface apparatus in response to test signals provided from that unit of the electronic device to that load board.

35. A test system as in claim 21 wherein the probe is a substantially non-intrusive probe.

36. A test system as in claim 21 wherein the probe is an intrusive probe.

37. A method of testing units of an electronic device with a test system comprising (a) at least one test head, (b) at least one load board for receiving a unit of the electronic device, each load board having a pattern of test-head signal transmission positions largely identical to the pattern of test-head signal transmission positions of each other, if any other, load board, (c) a probe system having a probe, and (d) an interface apparatus, the method comprising:
   performing at least one test operation with the test system deployed in a direct configuration in which one such load board that receives a unit of the electronic device is directly attached to one such test head for transmitting test signals through that load board's test-head signal transmission positions; and
   performing at least one test operation with the test system deployed in an interface configuration in which one such load board that receives a unit of the electronic device is coupled through the interface apparatus to one such test head for transmitting test signals through that load board's test-head signal transmission positions, in which the probe system contacts the interface apparatus or/and that load board, and in which the interface apparatus is configured to largely prevent vibrations in that test head from being transferred through the interface apparatus to the probe system.

38. A method as in claim 37 wherein:
   the interface apparatus comprises (a) a tester-side structure for attachment to the test head used in the interface configuration, (b) a device-side body for attachment to the load board used in the interface configuration, and (c) an isolation system for flexibly connecting the tester-side structure to the device-side body while largely preventing vibrations in the tester-side structure from being transmitted through the isolation system to the device-side body; and the act of performing at least one test operation with the test system deployed in the interface configuration entails passing test signals through electrical cables of the isolation system.

39. A method as in claim 37 wherein the act of performing at least one test operation with the test system deployed in the direct configuration comprises:

providing test signals from the test head used in the direct configuration to the load board used in the direct configuration for testing the unit under test; and providing test signals from that load board to that test head in response to test signals provided from that unit under test to that load board.

40. A method as in claim 39 wherein the act of performing at least one test operation with the test system deployed in the interface configuration comprises:

providing test signals from the interface apparatus to the load board used in the interface configuration for testing the unit under test in response to test signals provided from the test head used in the interface configuration to the interface apparatus; and providing test signals from the interface apparatus to that test head in response to test signals which are provided from that load board to the interface apparatus in response to test signals provided from that unit under test to that load board.

41. A method as in claim 37 wherein the act of performing at least one test operation with the test system deployed in the interface configuration includes attaching the load board used in the interface configuration to the interface apparatus by a substantial vacuum.

42. A method as in claim 41 wherein the act of performing test operations with the test system deployed in the interface configuration further includes attaching the test head used in the interface configuration to the interface apparatus by a substantial vacuum.

43. A method of testing units of an electronic device with a test system comprising (a) at least one test head, (b) at least one load board for receiving a unit of the electronic device, each load board having a pattern of test-head signal transmission positions largely identical to the pattern of test-head signal transmission positions of each other, if any other, load board, (c) a probe system having a probe, and (d) an interface apparatus, the method comprising:

performing at least one test operation with the test system deployed in a direct configuration in which one such load board that receives a unit of the electronic device is directly attached to one such test head for transmitting test signals through that load board's test-head signal transmission positions; and performing at least one test operation with the test system deployed in an interface configuration in which one such load board is attached by a substantial vacuum to the interface apparatus, in which that load board is coupled through the interface apparatus to one such test head for transmitting test signals through that load board's test-head signal transmission positions, and in which the probe system contacts the interface apparatus or/and that load board.

44. A method as in claim 43 wherein the vacuum is provided through the test head used in the interface configuration.

45. A method as in claim 43 wherein the act of performing at least one test operation with the test system deployed in the interface configuration includes attaching the interface apparatus by a substantial vacuum to the test head used in the interface configuration.

46. A method as in claim 43 wherein the act of performing at least one test operation with the test system deployed in the direct configuration includes attaching the load board used in the direct configuration by a substantial vacuum to the test head used in the direct configuration.

47. A method as in claim 43 wherein the act of performing at least one test operation with the test system deployed in the direct configuration comprises:

providing signals from the test head used in the direct configuration to the load board used in the direct configuration for testing the unit under test; and providing test signals from that load board to that test head in response to test signals provided from that unit under test to that load board.

48. A method in claim 47 wherein the act of performing at least one test operation with the test system deployed in the interface configuration comprises:

providing test signals from the interface apparatus to the load board used in the interface configuration for testing the unit under test in response to test signals provided from the test head used in the interface configuration to the interface apparatus; and providing test signals from the interface apparatus to that test head in response to test signals which are provided from that load board to the interface apparatus in response to test signals provided from that unit under test to that load board.

* * * * *